US012813146B2

(12) United States Patent
Lee et al.

(10) Patent No.: US 12,813,146 B2
(45) Date of Patent: Nov. 24, 2026

(54) DISPLAY DEVICE AND METHOD OF MANUFACTURING DISPLAY DEVICE

(71) Applicant: Samsung Display Co., LTD., Yongin-si (KR)

(72) Inventors: Jungkyu Lee, Yongin-si (KR); Jeongho Hwang, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 462 days.

(21) Appl. No.: 18/385,449

(22) Filed: Oct. 31, 2023

(65) Prior Publication Data

US 2024/0215411 A1 Jun. 27, 2024

(30) Foreign Application Priority Data

Dec. 27, 2022 (KR) ........................ 10-2022-0186067

(51) Int. Cl.

*H10K 59/80* (2023.01)
*H10K 59/12* (2023.01)
*H10K 59/122* (2023.01)

(52) U.S. Cl.

CPC ..... *H10K 59/8791* (2023.02); *H10K 59/1201* (2023.02); *H10K 59/122* (2023.02)

(58) Field of Classification Search

CPC ........... H10K 59/8791; H10K 59/1201; H10K 59/122

See application file for complete search history.

(56) References Cited

U.S. PATENT DOCUMENTS

| | | | | |
|---|---|---|---|---|
| 10,599,184 | B2 | 3/2020 | Kim et al. | |
| 11,380,875 | B2 | 7/2022 | Park et al. | |
| 12,114,526 | B2 | 10/2024 | Jeong et al. | |
| 2019/0148467 | A1 | 5/2019 | Chung et al. | |
| 2022/0140283 | A1 | 5/2022 | Kim et al. | |
| 2022/0312612 | A1 | 9/2022 | An et al. | |
| 2023/0017198 | A1 | 1/2023 | Lu et al. | |
| 2023/0171986 | A1* | 6/2023 | Lee .................... | H10K 59/8792 257/40 |
| 2023/0215301 | A1* | 7/2023 | Kishimoto .............. | G06F 3/046 361/679.27 |

FOREIGN PATENT DOCUMENTS

| | | | |
|---|---|---|---|
| KR | 101323992 | B1 | 10/2013 |
| KR | 1020170051854 | A | 5/2017 |
| KR | 1020200118266 | A | 10/2020 |
| KR | 20210085125 | A | 7/2021 |
| KR | 1020210145030 | A | 12/2021 |
| KR | 1020220053464 | A | 4/2022 |
| KR | 1020220058720 | A | 5/2022 |
| KR | 20220078379 | A | 6/2022 |

* cited by examiner

*Primary Examiner* — Anne M Hines

(74) *Attorney, Agent, or Firm* — CANTOR COLBURN LLP

(57) ABSTRACT

A display device includes a display module that includes a display panel including a display area and a non-display area and a light control layer disposed on the display panel, a step difference compensation layer that overlaps the non-display area, is disposed on the display module, and compensates for a step difference in the non-display area, and a window disposed on the display module. The window includes a light shielding layer overlapping the non-display area and a window coating layer.

20 Claims, 15 Drawing Sheets

DISPLAY DEVICE AND METHOD OF MANUFACTURING DISPLAY DEVICE

This application claims priority to Korean Patent Application No. 10-2022-0186067, filed on Dec. 27, 2022, and all the benefits accruing therefrom under 35 U.S.C. § 119, the content of which in its entirety is herein incorporated by reference.

BACKGROUND

1. Field

Embodiments of the disclosure relate to a display device and a method of manufacturing the same.

2. Description of the Related Art

A display device includes a window, a housing, and a display panel. The display panel may include various elements, such as a display element, a touch element, and a detection element, which are activated according to an electric signal.

The window protects the display panel and provides an active area to a user. Accordingly, the user provides input to the display panel through the window or receives information generated in the display panel. Further, the display panel may be stably protected from an external impact through the window.

SUMMARY

Embodiments of the disclosure provide a display device having improved reliability and a method of manufacturing the display device having improved reliability.

In an embodiment, a display device includes a display module that includes a display panel including a display area and a non-display area adjacent to the display area and a light control layer disposed on the display panel, a step difference compensation layer that overlaps the non-display area, is disposed on the display module, and compensates for a step difference in the non-display area, and a window disposed on the display module. The window may include a light shielding layer overlapping the non-display area and being disposed on the step difference compensation layer, and a window coating layer disposed on the light shielding layer and the display module.

In an embodiment, the display module may include a first surface corresponding to an upper surface of the display module and a second surface extending outward from the first surface, and the step difference may be defined between the first surface and the second surface.

In an embodiment, the step difference compensation layer may overlap the second surface in a plan view.

In an embodiment, the first surface may include a first portion overlapping the non-display area and a second portion overlapping the display area, and the step difference compensation layer may overlap the first portion.

In an embodiment, the step difference compensation layer may be disposed between the light shielding layer and the display module and include a resin.

In an embodiment, a thickness of the step difference compensation layer may be equal to an interval between the first surface and the second surface in a normal direction of the first surface.

In an embodiment, the display device may further include a dam disposed outside the step difference compensation layer in the non-display area.

In an embodiment, the step difference compensation layer may partially overlap the display area.

In an embodiment, the step difference compensation layer and the window coating layer may include a same material each other.

In an embodiment, the step difference compensation layer may be extended from the window coating layer in the display area to be unitary with the window coating layer.

In an embodiment, a thickness of the step difference compensation layer may be greater than an interval between the first surface and the second surface in a normal direction of the first surface.

In an embodiment, the window coating layer may overlap the display area and the non-display area and may contact an upper surface of the light control layer in the display area.

In an embodiment, the display panel may include a base layer, a pixel defining film which is disposed on the base layer and in which an opening is defined, a light emission element including a light emission layer disposed inside the opening, an inorganic deposition layer disposed on the light emission element, and an encapsulation layer disposed on the inorganic deposition layer.

In an embodiment, the light control layer may include at least one of a dye and a pigment, and the dye and the pigment included in the light control layer may have a maximum absorption wavelength in a wavelength range of about 490 nanometers (nm) to about 505 nm and about 585 nm to about 600 nm.

In an embodiment, the display module may further include an input sensing layer between the display panel and the light control layer.

In an embodiment, a method of manufacturing a display device includes forming a display module including a display panel including a display area and a non-display area and a light control layer disposed on the display panel, forming a step difference compensation layer on the display module so that the step difference compensation layer overlaps the non-display area, forming a light shielding layer overlapping the non-display area on the step difference compensation layer, and forming a window coating layer on the light shielding layer and the display module.

In an embodiment, the forming the step difference compensation layer may include applying a resin and forming a preliminary step difference compensation layer on the display module and curing the preliminary step difference compensation layer and forming the step difference compensation layer.

In an embodiment, the method may further include arranging a dam in the non-display area before the applying the resin. The dam may be disposed outside the preliminary step difference compensation layer in the non-display area.

In an embodiment, the step difference compensation layer may partially overlap the display area.

In an embodiment, the forming the window coating layer may include arranging the window coating layer on the light shielding layer and the step difference compensation layer.

BRIEF DESCRIPTION OF THE DRAWINGS

The above and other embodiments, advantages and features of the disclosure will become apparent by describing in detail embodiments thereof with reference to the accompanying drawings.

DETAILED DESCRIPTION

Figure 1:
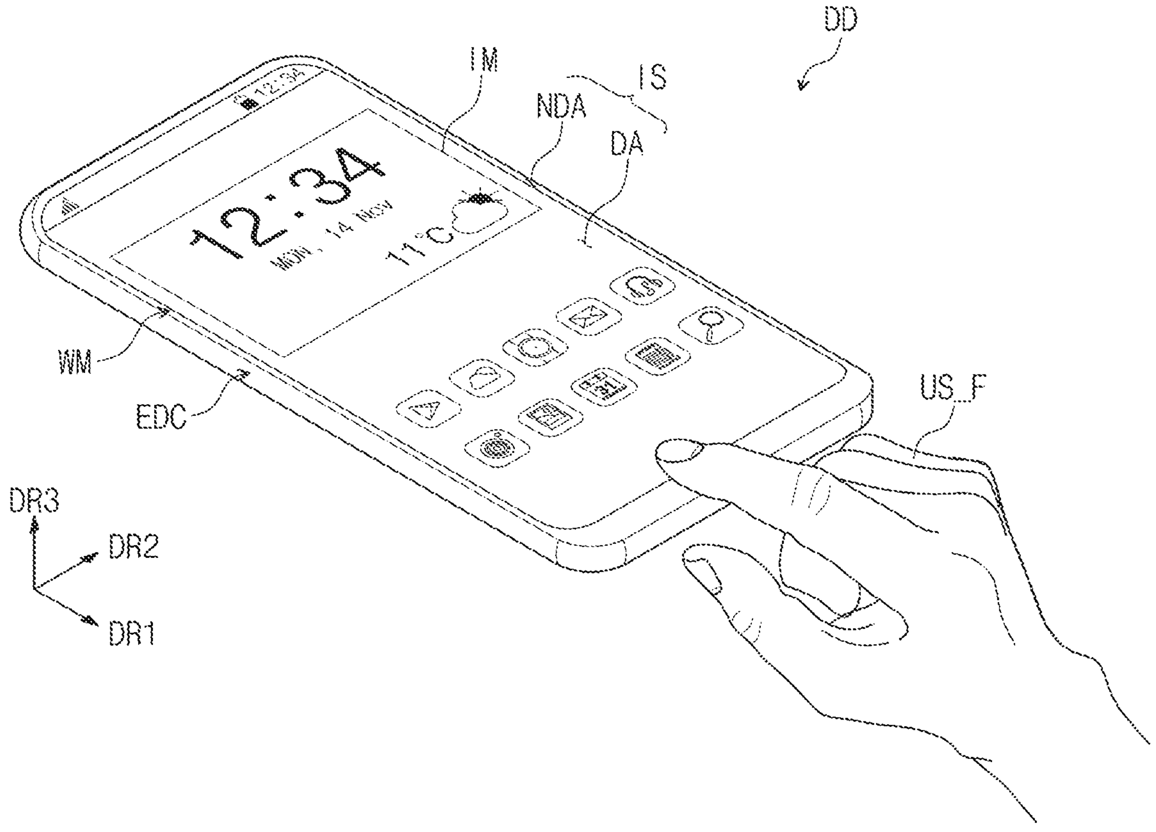
FIG. 1 is a perspective view of an embodiment of a display device according to the disclosure.

Since the disclosure is variously modified and has alternative forms, an embodiment thereof will be illustrated in the drawings and will herein be described in detail. However, it should be understood that the disclosure is not limited to a specific disclosure and includes all changes, equivalents, and substitutes included in the spirit and scope of the disclosure.

In the specification, the expression that a first component (or an area, a layer, a part, a portion, etc.) is "disposed on", "connected with" or "coupled to" a second component means that the first component is directly disposed on/connected with/coupled to the second component or means that a third component is interposed therebetween.

The same reference numerals refer to the same components. Further, in the drawings, the thickness, the ratio, and the dimension of components are exaggerated for effective description of technical contents.

The term "and/or" includes all combinations of one or more components that may be defined by associated configurations.

The terms "first", "second", etc. are used to describe various components, but the components should not be limited by the terms. The terms are only used to distinguish one component from another component. For example, without departing from the right scope of the present disclosure, a first component may be referred to as a second component, and similarly, the second component may be also referred to as the first component. Singular expressions include plural expressions unless clearly otherwise indicated in the context.

Further, the terms "under", "beneath", "on", "above", etc. are used to describe a relationship between components illustrated in the drawings. The terms have relative concepts and are described with reference to a direction indicated in the drawing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Unless otherwise defined, all terms (including technical terms and scientific terms) used in the specification have the same meaning as commonly understood by those skilled in the art to which the disclosure belongs. Further, terms defined should be construed as having the same meanings as those in the context of the related art and are explicitly defined therein unless the terms are interpreted in an ideal or excessive formal meaning.

It will be understood that the terms "include", "comprise", "have", etc. specify the presence of features, numbers, steps, operations, elements, or components, described in the specification, or any combinations thereof, not precluding the presence or additional possibility of one or more other features, numbers, steps, operations, elements, or components or any combinations thereof.

Hereinafter, an embodiment of the disclosure will be described with reference to accompanying drawings.

Figure 2:
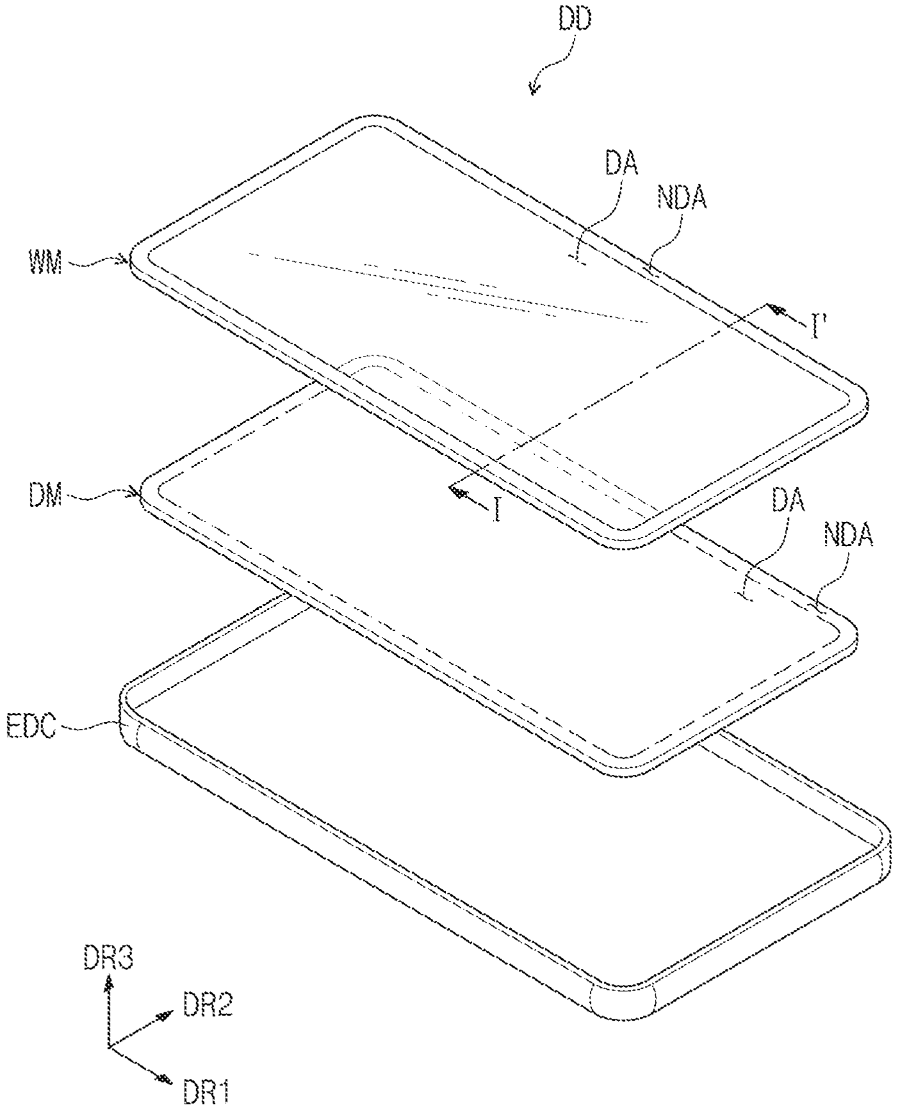
FIG. 2 is an exploded perspective view illustrating an embodiment of the display panel according to the disclosure.
Figure 3:
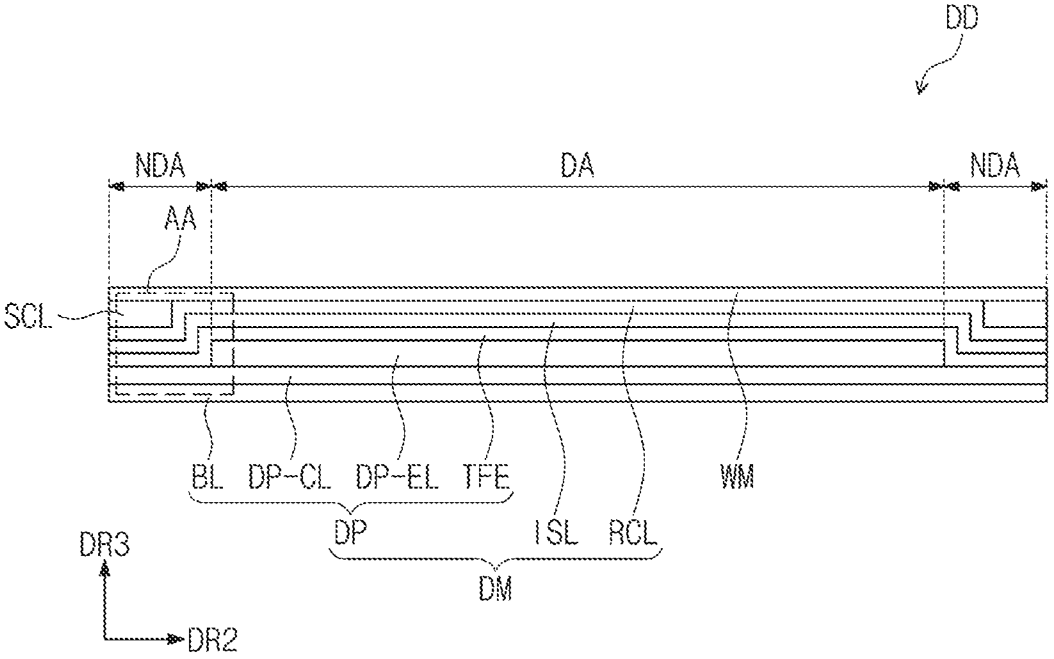
FIG. 3 is a cross-sectional view of an embodiment of the display device according to the disclosure.

FIG. 1 is a perspective view of an embodiment of a display device according to the disclosure. FIG. 2 is an exploded perspective view illustrating an embodiment of the display panel according to the disclosure. FIG. 3 is a cross-sectional view of an embodiment of the display device according to the disclosure.

Referring to FIGS. 1, 2, and 3, a display device DD in an embodiment of the disclosure may have a quadrangular shape, e.g., rectangular shape having long sides parallel to a first direction DR1 and short sides parallel to a second direction DR2 intersecting the first direction DR1. However, the disclosure is not limited thereto, and the display device DD may have various shapes such as a circular shape and polygonal shapes.

The display device DD may be a device that is activated according to an electric signal. The display device DD may include an embodiment. In an embodiment, the display device DD may be applied to electronic devices such as a smart watch, a tablet, a laptop, a computer, and a smart television.

Hereinafter, a normal direction substantially perpendicular to a plane defined by the first direction DR1 and the second direction DR2 is defined as a third direction DR3. In the specification, the wording "in a plan view" means a state viewed from the third direction DR3.

An upper surface of the display device DD may be defined as a display surface IS and may be parallel to the plane defined by the first direction DR1 and the second direction DR2. Images IM generated in the display device DD may be provided to a user through the display surface IS.

The display surface IS may be divided into a display area DA and a non-display area NDA. The display area DA may be an area on which the images IM are displayed. The user visually recognizes the images IM through the display area DA. In an embodiment, the display area DA has a quadrangular shape having rounded vertexes. However, this is illustratively illustrated, the display area DA may have various shapes, and the disclosure is not limited to a particular embodiment.

The non-display area NDA is adjacent to the display area DA. The non-display area NDA may have a predetermined color. The non-display area NDA may surround the display area DA. Accordingly, a shape of the display area DA may be substantially defined by the non-display area NDA. However, this is illustratively illustrated and the non-display area NDA may be disposed adjacent to only one side of the display area DA or may be omitted.

The display device DD may detect an external input applied from the outside. The external input may include various types of inputs provided from the outside of the display device DD. In an embodiment, the external input may include a contact by a part of a body of a user such as a hand US_F and a contact by a separate device (e.g., an active pen, a digitizer, or the like) as well as an external input (e.g., hovering) applied close to the display device DD or adjacent to the display device DD at a predetermined distance, for example. Further, the external input may have various forms such as a force, a pressure, a temperature, and a light beam.

The display device DD may detect biometric information of the user, which is applied from the outside. A biometric information detection area in which the biometric information of the user may detected may be provided to the display surface IS of the display device DD. The biometric information detection area may be provided to the entirety of the area of the display area DA or provided to a partial area of the display area DA. FIG. 1 illustrates that the entirety of the display area DA is utilized as the biometric information detection area as an embodiment of the disclosure.

The display device DD may include a window WM, a display module DM, and a housing EDC. In an embodiment, the window WM and the housing EDC are coupled to each other to constitute an exterior appearance of the display device DD.

A front surface of the window WM defines the display surface IS of the display device DD. The window WM may include an optically transparent insulating material. In an embodiment, the window WM may include a glass or plastic. The window WM may have a multi-layer structure or a single-layer structure, for example. In an embodiment, the window WM may include a plurality of plastic films coupled through an adhesive or include a glass substrate and a plastic substrate coupled through an adhesive, for example. However, the disclosure is not limited thereto, and the window WM may be formed by directly coating a resin on the display module DM. Accordingly, a separate lamination process of coupling the window WM and the display module DM may not be performed, and an adhesive for attaching the window WM and the display module DM may not be used.

The display module DM in an embodiment may be divided into the display area DA and the non-display area NDA. The display area DA may be an area that is activated according to an electric signal. The display area DA may be a portion that displays an image or detects the external input.

The non-display area NDA may be an area disposed adjacent to at least one side of the display area DA. The non-display area NDA may be disposed to surround the display area DA. However, the disclosure is not limited thereto, and unlike the illustration of FIG. 2, in an embodiment, a portion of the non-display area NDA may be omitted. A driving circuit or driving wiring line for driving the display area DA may be disposed in the non-display area NDA.

Referring to FIG. 3, the display module DM may include a display panel DP, an input sensing layer ISL, and a light control layer RCL. The display panel DP may display an image according to an electric signal, and the input sensing layer ISL may sense an external input applied from the outside. The external input may be provided in various forms.

The display panel DP in an embodiment of the disclosure may be a light emission display panel, but the disclosure is not particularly limited thereto. In an embodiment, the display panel DP may be an organic light emission display panel, an inorganic light emission display panel, or a quantum dot light emission display panel, for example. A light emission layer of the organic light emission display panel may include an organic light emission material, and a light emission layer of the inorganic light emission display panel may include an inorganic light emission material. A light emission layer of the quantum dot light emission display panel may include a quantum dot and a quantum rod. Hereinafter, the display panel DP will be described as the organic light emission display panel.

The display panel DP includes a base layer BL, a display element layer DP-EL, a circuit layer DP-CL, and an encapsulation layer TFE. The display panel DP according to the disclosure may be a flexible display panel. However, the disclosure is not limited thereto. In an embodiment, the display panel DP may be a foldable display panel that is folded with respect to a folding axis or a rigid display panel, for example.

The base layer BL may include a synthetic resin layer. The synthetic resin layer may be a polyimide-based resin layer, and a material thereof is not particularly limited thereto. In addition, the base layer BL may include a glass substrate, a metal substrate, an organic/inorganic composite material substrate, or the like.

The circuit layer DP-CL is disposed between the base layer BL and the display element layer DP-EL. The circuit layer DP-CL includes at least one insulating layer and at least one circuit element. Hereinafter, the insulating layer included in the circuit layer DP-CL is also referred to as an intermediate insulating layer. The intermediate insulating layer includes at least one intermediate inorganic layer and at least one intermediate organic layer. The circuit element may include a pixel driving circuit included in a plurality of pixels for displaying an image. The circuit layer DP-CL may further include signal lines connected to the pixel driving circuit and/or a sensor driving circuit.

The display element layer DP-EL may include a light emission element included in each of the pixels. The light emission element may be provided as a plurality of light emission elements, and the plurality of light emission elements may correspond to a plurality of light emission areas. In an embodiment, the plurality of light emission areas may include a red light emission area, a green light emission area, and a blue light emission area, for example.

The encapsulation layer TFE is disposed on the display element layer DP-EL to seal the display element layer DP-EL. The encapsulation layer TFE may include at least one organic layer and at least one inorganic layer. The inorganic layer may include an inorganic material and protect the display element layer DP-EL from moisture/oxygen. The inorganic layer may include a silicon nitride layer, a silicon oxynitride layer, a silicon oxide layer, a titanium oxide layer, an aluminum oxide layer, or the like, but the disclosure is not particularly limited thereto. The organic layer may include an organic material and protect the display element layer DP-EL from foreign substances such as dust particles.

The input sensing layer ISL may be formed on the display panel DP. The input sensing layer ISL may be directly disposed on the encapsulation layer TFE. In an embodiment of the disclosure, the input sensing layer ISL may be formed on the display panel DP by a subsequent process. That is, when the input sensing layer ISL is directly disposed on the display panel DP, an adhesive film is not disposed between the input sensing layer ISL and the encapsulation layer TFE. In an alternative embodiment, an adhesive film may be disposed between the input sensing layer ISL and the display panel DP. In this case, the input sensing layer ISL is not manufactured by a subsequent process together with the display panel DP, may be manufactured through a separate process from the display panel DP, and may be then fixed to an upper surface of the display panel DP by the adhesive film.

The input sensing layer ISL may sense the external input (e.g., a touch of the user), change the sensed external input into a predetermined input signal, and provide the input signal to the display panel DP. The input sensing layer ISL may include a plurality of sensing electrodes for sensing the external input. The sensing electrodes may sense the external input in a capacitive manner. The display panel DP may receive the input signal from the input sensing layer ISL and generate an image corresponding to the input signal.

The light control layer RCL may be disposed on the input sensing layer ISL. The light control layer RCL may be an anti-reflection layer that reduces a reflectance of an external light beam input from the outside. The light control layer RCL may be a layer that selectively transmits a light beam emitted from the display panel DP. The light control layer RCL may not include a polarization layer. Accordingly, the light beam input to the display panel DP and the input sensing layer ISL through the light control layer RCL may be a non-polarized light beam. The display panel DP and the input sensing layer ISL may receive the non-polarized light beam from the light control layer RCL. However, the disclosure is not limited thereto. The light control layer RCL may be a color filter layer including separate filter units and a black matrix. Although not illustrated, the filter units may include a red filter unit, a green filter unit, and a blue filter unit. The red filter unit, the green filter unit, and the blue filter unit may be portions disposed to correspond to the red light emission area, the green light emission area, the blue light emission area, respectively.

In the display device DD according to the disclosure, the window WM may be directly disposed on the light control layer RCL. However, the disclosure is not limited thereto, and the display device DD may further include an adhesive layer. The window WM may be attached onto the light control layer RCL by the adhesive layer. The adhesive layer may include an optical clear adhesive, an optically clear adhesive resin, or a pressure-sensitive adhesive.

Referring to FIG. 3, the display device DD may further include a step difference compensation layer SCL disposed on the display module DM. The step difference compensation layer SCL may be a layer that overlaps the non-display area NDA, is disposed between the display module DM and the window WM, and compensates for a step difference of the display module DM in the non-display area NDA. A detailed content therefor will be described below.

Referring back to FIGS. 1 and 2, the housing EDC is coupled to the window WM. The housing EDC is coupled to the window WM to provide a predetermined inner space. The display module DM may be accommodated in the inner space. The housing EDC may include a material having a relatively high rigidity. In an embodiment, the housing EDC may include a plurality of frames and/or plates including glass, plastic, or metal or combinations thereof, for example. The housing EDC may stably protect components of the display device DD accommodated in the inner space from an external impact. Although not illustrated, a battery module or the like for supplying power desired for overall operation of the display device DD may be disposed between the display module DM and the housing EDC.

Figure 4:
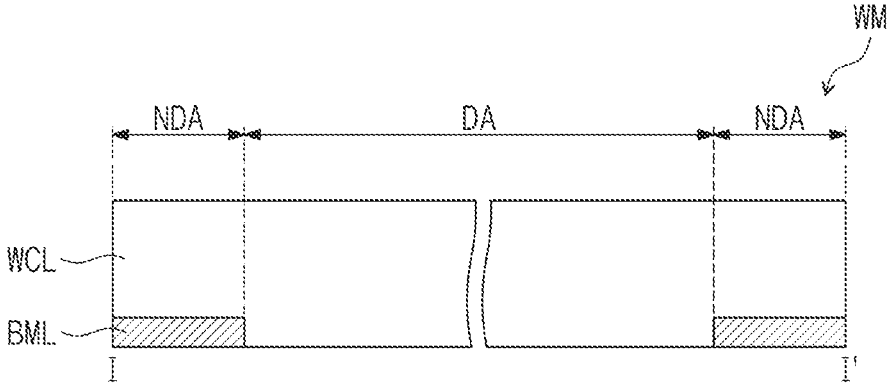
FIG. 4 is a cross-sectional view of a window along cutting line I-I' illustrated in FIG. 2.

FIG. 4 is a cross-sectional view of a window along cutting line I-I' illustrated in FIG. 2.

Referring to FIG. 4, the window WM may include the display area DA and the non-display area NDA. The display area DA may be an area that transmits the light beam, may be defined in a central portion of the window WM in a plan view, and may occupy most of a planar area of the window WM. The non-display area NDA may be disposed at at least one side of the display area DA. The non-display area NDA may be defined in an edge area of the window WM in a plan view. The non-display area NDA may be defined along a side surface of the window WM.

The window WM may include a light shielding layer BML and a window coating layer WCL.

The light shielding layer BML may be disposed in a border area of the window WM. In detail, the light shielding layer BML may overlap the non-display area NDA of the window WM in a plan view. The light shielding layer BML may overlap the entirety of the non-display area NDA and may not overlap the display area DA. The light shielding layer BML may be an ink printed layer. Further, the light shielding layer BML may be a layer formed by including pigments or dyes. The light shielding layer BML may include a shielding ink that shields the light beam. In an embodiment, the shielding ink layer may include a base material and a shielding ink. The shielding ink may be a carbon black particle, for example. However, the disclosure is not limited thereto, and the shielding ink may include one or more types of pigments and dyes or combinations thereof in addition to the carbon black particle. Components inside the display device DD overlapping the non-display area NDA may be prevented from being visually recognized, by the light shielding layer BML shielding the light beam.

The window coating layer WCL may be a component disposed on the uppermost side of the window WM and defining an upper surface of the window WM. That is, an upper surface of the window coating layer WCL may correspond to the upper surface of the window WM. However, the disclosure is not limited thereto, the window WM may further include a functional coating layer disposed on the upper surface of the window coating layer WCL, and the functional coating layer disposed on the uppermost side of the window WM may also define the upper surface of the window WM. The functional coating layer may include at least one of an anti-fingerprint layer, an anti-reflection layer, and a hard coating layer.

The window coating layer WCL may at least partially overlap the display area DA in a plan view. In the display area DA, a thickness of the window coating layer WCL may be equal to a thickness of the window WM. In the non-display area NDA, the window coating layer WCL is disposed on the light shielding layer BML. In the non-display area NDA, the thickness of the window coating layer WCL may be smaller than the thickness of the window WM. In the non-display area NDA, a sum of the thickness of the window coating layer WCL and a thickness of the light shielding layer BML may be equal to the thickness of the window WM. Thus, in the display area DA and the non-display area NDA, the window WM may have a constant thickness.

A side surface of the window coating layer WCL and a side surface of the light shielding layer BML may have shapes aligned side by side. However, the disclosure is not limited thereto, and the side surface of the window coating layer WCL and the side surface of the light shielding layer BML may be misaligned. In an embodiment, the side surface of the light shielding layer BML may be disposed inside the side surface of the window coating layer WCL, for example.

The window coating layer WCL may have a light transmittance of about 90% or more. The window coating layer WCL may include a material having a light transmittance of about 90% or more. In an embodiment of the disclosure, the window coating layer WCL may include at least one selected from the groups consisting of polycarbonate, polymethylmethacrylate, polyimide, polyethylene terephthalate, polyacrylate, polyethylenenaphthalate, polyvinylidene chloride, polyvinylidene difluoride, polystyrene, ethylene vinylalcohol copolymer, and triacetyl cellulose. However, the material of the window coating layer WCL is not limited thereto.

Figure 5:
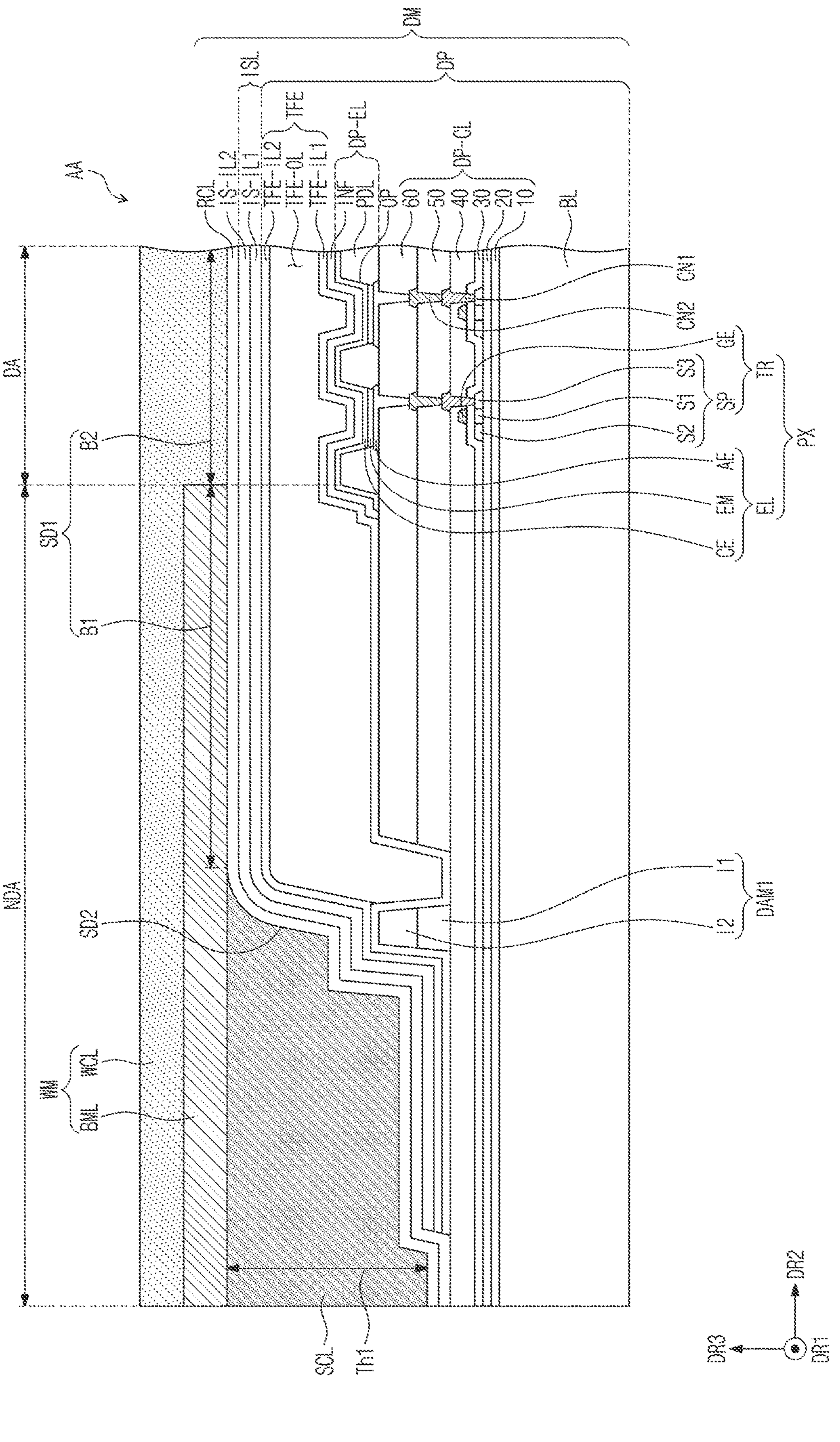
FIG. 5 is an enlarged cross-sectional view of a portion corresponding to area AA of FIG. 3.

FIG. 5 is a cross-sectional view of an embodiment of the display device according to the disclosure. In detail, FIG. 5 is an enlarged cross-sectional view of a portion corresponding to area AA of FIG. 3.

Referring to FIG. 5, the display panel DP may include the base layer BL, the circuit layer DP-CL, the display element layer DP-EL, and the encapsulation Layer TFE. The above description may be equally applied to a description of each component of the display panel DP.

The base layer BL may include a glass substrate, a metal substrate, or an organic/inorganic composite material substrate. In an embodiment, the base layer BL may include a synthetic resin layer. In an embodiment, the synthetic resin layer may include at least one of an acryl-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin, for example. However, the material of the base layer BL is not limited to the above embodiment.

The circuit layer DP-CL may be disposed on the base layer BL. The circuit layer DP-CL may include at least one insulating layer, a conductive pattern, and a semiconductor pattern. In an operation of manufacturing the display panel DP, after the insulating layer, the semiconductor layer, and the conductive layer are formed on the base layer BL in a method such as a coating method and a deposition method, the insulating layer, the semiconductor layer, and the conductive layer may be patterned in a photolithography method. The semiconductor pattern, the conductive pattern, the signal line, or the like included in the circuit layer DP-CL may be formed through this process.

FIG. 5 illustrates first to sixth insulating layers 10 to 60 included in the circuit layer DP-CL and the semiconductor pattern and the conductive pattern arranged between the base layer BL and the first to sixth insulating layers 10 to 60. However, the cross section of the circuit layer DP-CL illustrated in FIG. 5 is illustrative, and a laminated structure of the circuit layer DP-CL may be variously changed according to a process operation, a process method, or a configuration of elements included in a pixel.

The first insulating layer 10 may be disposed on the base layer BL. The first insulating layer 10 may include an inorganic layer and may be provided as a barrier layer on the base layer BL. The first insulating layer 10 provided as the barrier layer may prevent foreign substances from being introduced from the outside. The first insulating layer 10 may include at least one of a silicon oxide layer and a silicon nitride layer. In an embodiment, the first insulating layer 10 provided as the barrier layer may include silicon oxide layers and silicon nitride layers which are alternately laminated.

The second insulating layer 20 may be disposed on the first insulating layer 10. The second insulating layer 20 may include an inorganic layer and may be provided as a buffer layer on the base layer BL. The second insulating layer 20 provided as the buffer layer may increase a coupling force between the base layer BL and the semiconductor pattern or the conductive pattern. The second insulating layer 20 may include at least one of a silicon oxide layer and a silicon nitride layer. In an embodiment, the second insulating layer 20 provided as the buffer layer may include silicon oxide layers and silicon nitride layers which are alternately laminated.

Pixels PX may be arranged on the second insulating layer 20. Each of the pixels PX may have an equivalent circuit including a transistor TR, at least one capacitor, and a light emission element EL, and the equivalent circuit of the pixel PX may be modified in various forms. The semiconductor pattern may be disposed in a predetermined rule across the pixels PX according to the equivalent circuit of the pixel PX. FIG. 5 illustratively illustrates a partial configuration of the one pixel PX.

The transistor TR may include a semiconductor pattern SP and a gate GE. The semiconductor pattern SP may be disposed on the second insulating layer 20. The semiconductor pattern SP may include a silicon semiconductor, and may include a single-crystal silicon semiconductor, a polysilicon semiconductor, or an amorphous silicon semiconductor. The disclosure is not limited thereto, and the semiconductor pattern SP may also include an oxide semiconductor. The semiconductor pattern SP in an embodiment of the disclosure may include or consist of various materials as long as the materials have semiconductor properties, and is not limited to a particular embodiment.

A source S2, a drain S3, and a channel S1 of the transistor TR may be formed from the semiconductor pattern SP. The semiconductor pattern SP may be divided into a plurality of areas according to conductivity. In an embodiment, the semiconductor pattern SP may have different electrical properties depending on whether the semiconductor pattern SP is doped or is reduced by metal oxide, for example. An area having the largest conductivity among the semiconductor pattern may serve as an electrode or a signal line and correspond to the source S2 and the drain S3 of the transistor TR. An area having relatively small conductivity, which is not doped or not reduced, may correspond to the channel S1 (or an active) of the transistor TR.

In an embodiment, the semiconductor pattern SP may include a first area having higher conductivity and a second area having lower conductivity. The first area may be doped with an N-type dopant or a P-type dopant. A P-type transistor may include a doped area doped with the P-type dopant, and an N-type transistor may include a doped area doped with the N-type dopant. The second area may be a non-doped area or an area doped at a concentration lower than the concentration of the first area.

In an embodiment, the semiconductor pattern SP may include a plurality of areas classified according to whether the metal oxide is reduced. An area (hereinafter, also referred to as a reduced area) in which the metal oxide is reduced has higher conductivity than that of an area (hereinafter, a non-reduced area) in which the metal oxide is not reduced. The reduced area may substantially serve as an electrode of the transistor TR, and the non-reduced area may substantially correspond to the channel of the transistor TR.

The third to sixth insulating layers 30 to 60 may be laminated on the semiconductor pattern SP. The third to sixth insulating layers 30 to 60 may include inorganic layers or organic layers. In an embodiment, the inorganic layer may include at least one of an aluminum oxide, a titanium oxide, a silicon oxide, a silicon nitride, a silicon oxynitride, a zirconium oxide, or a hafnium oxide, for example. The organic layer may include a phenol-based polymer, an acryl-based polymer, an imide-based polymer, an arylether-based polymer, an amide-based polymer, a fluorine-based polymer, a p-xylene-based polymer, a vinyl alcohol-based polymer, and polymers obtained by any combinations thereof. However, the material of the insulating layer is not limited to the above embodiment.

The third insulating layer 30 may be disposed on the second insulating layer 20 to cover the semiconductor pattern SP. The third insulating layer 30 may be disposed between the semiconductor pattern SP and the gate GE of the transistor TR. In an embodiment, the third insulating layer 30 may be an inorganic layer having a single-layer structure or a multi-layer structure.

The gate GE may be disposed on the third insulating layer 30. The gate GE may be a portion of the conductive pattern of the circuit layer DP-CL. In a plan view, the gate GE may overlap the channel S1 of the transistor TR. The gate GE may function as a mask in a process of doping the semiconductor pattern SP.

The transistor TR of FIG. 5 is illustratively illustrated, and the source S2 or the drain S3 may be electrodes formed independently from the semiconductor pattern SP. In this case, the source S2 and the drain S3 may contact the semiconductor pattern SP or connected to the semiconductor pattern SP through the insulating layers. Further, in an embodiment, the gate GE may be disposed below the semiconductor pattern SP. The transistor TR in an embodiment of the disclosure may have various structures, and is not limited to a particular embodiment.

The fourth insulating layer 40 may be disposed on the third insulating layer 30 to cover the gate GE. In an embodiment, the fourth insulating layer 40 may be an inorganic layer having a single-layer structure or a multi-layer structure. The fifth insulating layer 50 may be disposed on the fourth insulating layer 40. In an embodiment, the fifth insulating layer 50 may be an organic layer having a single-layer structure or a multi-layer structure.

A first connection electrode CN1 may be disposed on the fourth insulating layer 40. A second connection electrode CN2 may be disposed on the fifth insulating layer 50. The first connection electrode CN1 may be electrically connected to the semiconductor pattern SP through a contact hole passing through the third insulating layer 30 and the fourth insulating layer 40. The second connection electrode CN2 may be electrically connected to the first connection electrode CN1 through a contact hole passing through the fifth insulating later 50. The sixth insulating layer 60 may be disposed on the fifth insulating layer 50 to cover the second connection electrode CN2.

At least one of the first connection electrode CN1 and the second connection electrode CN2 may be omitted. In an alternative embodiment, an additional connection electrode for connecting the light emission element EL and the transistor TR may be further disposed. An electrical connection method between the light emission element EL and the transistor TR may be variously changed depending on the number of insulating layers disposed between the light emission element EL and the transistor TR, and is not limited to a particular embodiment.

The display element layer DP-EL may be disposed on the circuit layer DP-CL. The display element layer DP-EL may include the light emission element EL and a pixel defining film PDL. The light emission element EL may be electrically connected to the transistor TR to constitute the pixel PX. The light emission element EL may be disposed on the display area DA to emit a light beam. In an embodiment, the light emission element EL may include an organic light emission element, a quantum dot light emission element, a micro light emission diode ("LED") light emission element, or a nano LED light emission element. However, the disclosure is not limited thereto, and the light emission element EL may include an embodiment as long as a light beam may be generated or the quantity of light beam may be controlled according to an electrical signal.

The light emission element EL may include a first electrode AE, a light emission layer EM, and a second electrode CE. The first electrode AE may be disposed on the sixth insulating layer 60. The first electrode AE may be connected to the second connection electrode CN2 through a contact hole passing through the sixth insulating layer 60.

The pixel defining film PDL may be disposed on the first electrode AE and the sixth insulating layer 60 and may expose at least a portion of the first electrode AE. That is, a light emission opening OP, which exposes at least a portion of the first electrode AE, may be defined by the pixel defining film PDL.

The pixel defining film PDL may include or consist of a polymer resin. In an embodiment, the pixel defining film PDL may include a polyacrylate-based resin or a polyimide-based resin, for example. The pixel defining film PDL may further include an inorganic material in addition to the polymer resin. Further, the pixel defining film PDL may include or consist of an inorganic material. In an embodiment, the pixel defining film PDL may include silicon nitride (SiNx), silicon oxide (SiOx), silicon nitride oxide (SiOxNy), or the like, for example.

In an embodiment, the pixel defining film PDL may include a light absorbing material. The pixel defining film PDL may include a black coloring agent. The black coloring agent may include black dye and black pigment. The black coloring agent may include carbon black, metal such as chromium, or an oxide thereof.

The light emission layer EM may be disposed on the first electrode AE. The light emission layer EM may be disposed to correspond to the light emission opening OP of the pixel defining film PDL. However, the disclosure is not limited thereto, and the light emission layer EM may extend toward an upper surface of the pixel defining film PDL and commonly disposed in the plurality of pixels PX.

The light emission layer EM may provide a light beam having a predetermined color. The light emission layer EM may include an organic light emission material and/or an inorganic light emission material. In an embodiment, the light emission layer EM may include a fluorescent or phosphorescent material, a metal organic complex luminescent material, or a quantum dot, for example. FIG. 5 illustratively illustrates the patterned single-layered light emission layer EM, but the disclosure is not limited thereto, and the light emission layer EM may have a multi-layered structure. In an embodiment, the light emission layer EM may include a main light emission layer and an auxiliary light emission layer disposed on the main light emission layer, for example. The main light emission layer and the auxiliary light emission layer may be provided to have different thicknesses according to a wavelength of an emitted light beam, and the auxiliary light emission layer may be disposed to adjust a resonance distance of the light emission element EL. Further, the auxiliary light emission layer is disposed so that color purity of the light beam output from the light emission layer EM may be improved.

The second electrode CE may be disposed on the light emission layer EM. The second electrode CE may be commonly disposed in the pixels PX. A common voltage may be provided to the second electrode CE, and the second electrode CE may be also referred to as a common electrode.

The light emission element EL may further include light emission functional layers arranged between the first electrode AE and the second electrode CE. In an embodiment, the light emission element EL may include a hole transport layer or a hole injection layer disposed between the first electrode AE and the light emission layer EM and may include an electron transport layer or an electron injection layer disposed between the light emission layer EM and the second electrode CE, for example.

Through the transistor TR, a first voltage may be applied to the first electrode AE, and the common voltage may be applied to the second electrode CE. A hole and an electron injected into the light emission layer EM are combined to form an exciton, and as the exciton transitions to the ground state, the light emission element EL may emit a light beam through the display area DA.

The display element layer DP-EL in an embodiment of the disclosure may further include an inorganic deposition layer INF disposed on the light emission element EL. Although not illustrated, a capping layer may be disposed between the light emission element EL and the inorganic deposition layer INF. The inorganic deposition layer INF may be directly disposed on the capping layer. The inorganic deposition layer INF may be a layer for preventing an external light beam from being reflected by the second electrode CE of the light emission element EL. In more detail, destructive interference may occur between a light beam reflected from a surface of the inorganic deposition layer INF and a light beam reflected from the second electrode CE, so that the amount of an external light beam reflected from the surface of the second electrode CE may be reduced. A thickness of the inorganic deposition layer INF may be adjusted so that the destructive interference may occur between the light beam reflected from the surface of the inorganic deposition layer INF and the light beam reflected from the second electrode CE.

The inorganic deposition layer INF may include an inorganic material having a refractive index of about 1.0 or more and a light absorption coefficient of about 0.5 or more. The inorganic deposition layer INF may be formed through a thermal evaporation process and may include an inorganic material having a melting point of about 1000 degrees Celsius (° C.) or less. The inorganic deposition layer INF may include at least one selected from the groups consisting of bismuth (Bi) and ytterbium (Yb), for example. The material for forming the inorganic deposition layer INF may be bismuth (Bi), ytterbium (Yb), or a mixed deposition material ($Yb_xBi_y$). The encapsulation layer TFE may be directly disposed on at least a portion of the inorganic deposition layer INF.

The encapsulation layer TFE may be disposed on the display element layer DP-EL to cover the light emission element EL. The encapsulation layer TFE may seal the light emission element EL. The encapsulation layer TFE may include at least one insulating film, and the insulating film may be provided as an inorganic film or an organic film. In an embodiment, the encapsulation layer TFE may include a plurality of insulating films, at least one of the plurality of insulating films may be provided as an organic film, and at least one thereof may be provided as an inorganic film. FIG. 5 illustratively illustrates the encapsulation layer TFE including a first inorganic film TFE-IL1, a second inorganic film TFE-IL2, and an organic film TFE-OL. The first inorganic film TFE-IL1 may be disposed on the second electrode CE. The organic film TFE-OL may be disposed on the first inorganic film TFE-IL1. The second inorganic film TFE-IL2 may be disposed on the organic film TFE-OL to cover the organic film TFE-OL. However, a laminated structure of the encapsulation layer TFE is not limited to a particular embodiment.

The first inorganic film TFE-IL1 and the second inorganic film TFE-IL2 may protect the light emission element EL from moisture and/or oxygen. In an embodiment, the first inorganic film TFE-IL1 and the second inorganic film TFE-IL2 may include at least one of aluminum oxide, titanium oxide, silicon oxide, silicon nitride, silicon oxynitride, zirconium oxide, and hafnium oxide, for example, but the material thereof is not limited to the above embodiment.

The organic film TFE-OL may protect the light emission element EL from foreign substances such as dust particles. In an embodiment, the organic film TFE-OL may include an acryl-based resin, for example, but the material thereof is not limited to the above embodiment. The first inorganic film TFE-IL1 may extend from the display area DA and may be disposed on the non-display area NDA.

The organic film TFE-OL may be obtained by providing a liquid polymer resin onto the first inorganic film TFE-IL1 and then curing the liquid polymer resin. The liquid polymer resin may be formed through a vapor deposition technique, a printing technique, or a slit coating technique, but the disclosure is not limited thereto. In an embodiment, the organic film TFE-OL may be formed through an ink-jet process.

As the organic film TFE-OL includes or consists of a liquid resin having fluidity, the display panel DP may desire a configuration for controlling flow of the liquid resin. The display panel DP may further include a first dam DAM1. The first dam DAM1 may be disposed on the non-display area NDA. The first dam DAM1 may be disposed outside the organic film TFE-OL. The first dam DAM1 may control flow of the organic film TFE-OL toward an outer edge of the base layer BL. The first dam DAM1 may have a multi-layered structure. In an embodiment, the first dam DAM1 may include a first layer I1 and a second layer I2, for example. At least some of the layers I1 and I2 included in the first dam DAM1 may be simultaneously formed during a process of forming the insulating layers 10 to 60 of the circuit layer DP-CL or the pixel defining film PDL. However, the first dam DAM1 may have a single-layer structure or a multi-layer structure having a larger number of layers than those illustrated, and the disclosure is not limited to a particular embodiment.

The second inorganic film TFE-IL2 of the encapsulation layer TFE may extend from the display area DA to the non-display area NDA, and the second inorganic film TFE-IL2 may cover the first dam DAM1 on the non-display area NDA. The second inorganic film TFE-IL2 may seal the organic film TFE-OL of the encapsulation layer TFE and prevent moisture or oxygen from being introduced into the organic film TFE-OL from the outside.

The input sensing layer ISL may be disposed on the display panel DP. The input sensing layer ISL may include first and second sensing insulating layers IS-IL1 and IS-IL2 and first and second conductive layers. In FIG. 5, illustration of a third sensing insulating layer of the input sensing layer ISL is omitted, but the third sensing insulating layer may be disposed on the second sensing insulating layer IS-IL2.

The first sensing insulating layer IS-IL1 may be disposed on the encapsulation layer TFE. The first sensing insulating layer IS-IL1 may be formed through a subsequent process after the encapsulation layer TFE is formed, and the first sensing insulating layer IS-IL1 may contact the uppermost layer of the encapsulation layer TFE. Referring to FIG. 5, in an embodiment, the first sensing insulating layer IS-IL1 may contact the second inorganic film TFE-IL2 formed as the uppermost layer of the encapsulation layer TFE. The first sensing insulating layer IS-IL1 may extend from the display area DA and may be disposed on the non-display area NDA.

The first conductive layer and the second conductive layer of the input sensing layer ISL may include sensing electrodes or sensing signal lines. FIG. 5 illustratively and briefly illustrates a cross-section of components of the input sensing layer ISL, the components are described on the basis of the illustration, but arrangement of the components of the input sensing layer ISL is not limited to the illustration.

The light control layer RCL may cover a front surface of the display panel DP and protect the display panel DP. However, the disclosure is not limited thereto, and the light control layer RCL may overlap the display area DA and may be disposed on the input sensing layer ISL. The light control layer RCL may absorb a portion of a light beam emitted from the display panel DP through the light control layer RCL and transmit the other portion thereof, thereby improving a color reproduction rate. The color reproduction rate refers to a range of colors that may be displayed by a display device. In an embodiment, the color reproduction rate may be improved by selectively absorbing a light beam in a predetermined wavelength range, for example.

The light control layer RCL disposed on the display panel DP may not include a polarizing material and may be a layer in which a dye and/or a pigment is dispersed in a base resin. As the light control layer RCL does not include the polarizing material, the light beam input to the display panel DP and the input sensing layer ISL through the light control layer RCL may be a non-polarized light beam. The display panel DP and the input sensing layer ISL may receive the non-polarized light beam from the light control layer RCL.

The dye and the pigment included in the light control layer RCL may be materials that transmit only a light beam in a predetermined wavelength range among the light beam emitted from the light emission element EL. In an embodiment, the dye and the pigment may be materials that absorb a light beam having a wavelength in a range of about 490 nanometers (nm) to about 505 nm and a light beam having a wavelength in a range of about 585 nm to about 600 nm and transmit the other light beam. The dye and the pigment may have a maximum absorption wavelength in the wavelength in a range of about 490 nm to about 505 nm and in the wavelength in a range of about 585 nm to about 600 nm. As the dye and the pigment included in the light control layer RCL absorb the light beam having a predetermined wavelength and transmit the other light beam having the other wavelength, reflection by an external light beam may be prevented, and a color sense of the light beam output from the display panel DP may be adjusted.

The display module DM may include a first surface SD1 corresponding to an upper surface of the display module and a second surface SD2 extending from the first surface SD1. The second surface SD2 may overlap the non-display area NDA of the display module DM in a plan view. The first surface SD1 may have a flat surface so that a component disposed on the display module DM may be disposed on the flat surface. In an embodiment of the disclosure, the first surface SD1 may include a first portion B1 overlapping the non-display area NDA and a second portion B2 overlapping the display area DA. The second surface SD2 may be defined as a surface extending from the first portion B1 in a direction opposite to the second direction DR2.

The step difference compensation layer SCL may be disposed on the display module DM. In detail, the step difference compensation layer SCL may be defined as a layer disposed to overlap the non-display area NDA and compensating for a step difference between the first surface SD1 and the second surface SD2. The step difference compensation layer SCL may overlap the second surface SD2 in a plan view. That is, the step difference compensation layer SCL may be formed in direct contact with the second surface SD2. Although not illustrated, the step difference compensation layer SCL may overlap a portion of the first surface SD1. In detail, the step difference compensation layer SCL may be disposed on the first portion B1 of the first surface SD1.

In an embodiment of the disclosure, a thickness Th1 of the step difference compensation layer SCL overlapping the second surface SD2 may be the same as a step difference between the first surface SD1 and the second surface SD2. In detail, the thickness Th1 of the step difference compensation layer SCL may be the same as an interval between an extension surface of the first surface SD1 and the second surface SD2 in a normal direction of the first surface SD1, that is, in the third direction DR3. Thus, as an upper surface of the step difference compensation layer SCL extends from the first surface SD1 of the display module DM in the second direction DR2 and is formed in parallel, a flat surface may be provided on the step difference compensation layer SCL and the display module DM.

In an embodiment of the disclosure, the step difference compensation layer SCL may include or consist of an adhesive resin. The resin may include at least one of an acryl-based resin, a silicone-based resin, and a urethane-based resin. A resin component may include an uncured oligomer or monomer. The uncured oligomer or monomer may include a cross-linking reactor. Further, the resin may further include an initiator and a curing agent. The initiator may be a thermal initiator or a photoinitiator. The step difference compensation layer SCL may be a coating layer having hard properties, which is obtained after the resin is cured. In an embodiment of the disclosure, the step difference compensation layer SCL may have a modulus of about 1 gigapascal (GPa) or more.

The window WM may be disposed on the step difference compensation layer SCL and the display module DM. Duplicated descriptions of the components of the window WM will be omitted. The window WM may include the light shielding layer BML and the window coating layer WCL. The light shielding layer BML may overlap the non-display area NDA and may be directly disposed on the step difference compensation layer SCL. The light shielding layer BML may be in direct contact with the upper surface of the step difference compensation layer SCL and the first surface SD1 of the display module DM. Since the light shielding layer BML overlaps the non-display area NDA, the light shielding layer BML may be disposed on the first portion B1 of the first surface SD1. The display device DD in an embodiment of the disclosure includes the step difference compensation layer SCL for compensating for the step difference of the display module DM in the non-display area NDA so that the light shielding layer BML is disposed on the flat surface. Thus, insufficient coating of the light shielding layer BML disposed on the step difference compensation layer SCL and the display module DM may be improved, and accordingly, boundary visibility occurring in an area overlapping the second surface SD2 may be prevented, The window coating layer WCL may be disposed on the display module DM. The window coating layer WCL may overlap the display area DA and the non-display area NDA. The window coating layer WCL may be formed in direct contact with an upper surface of the light shielding layer BML in the non-display area NDA and in direct contact with the first surface SD1 of the display module DM in the display area DA.

Figure 6:
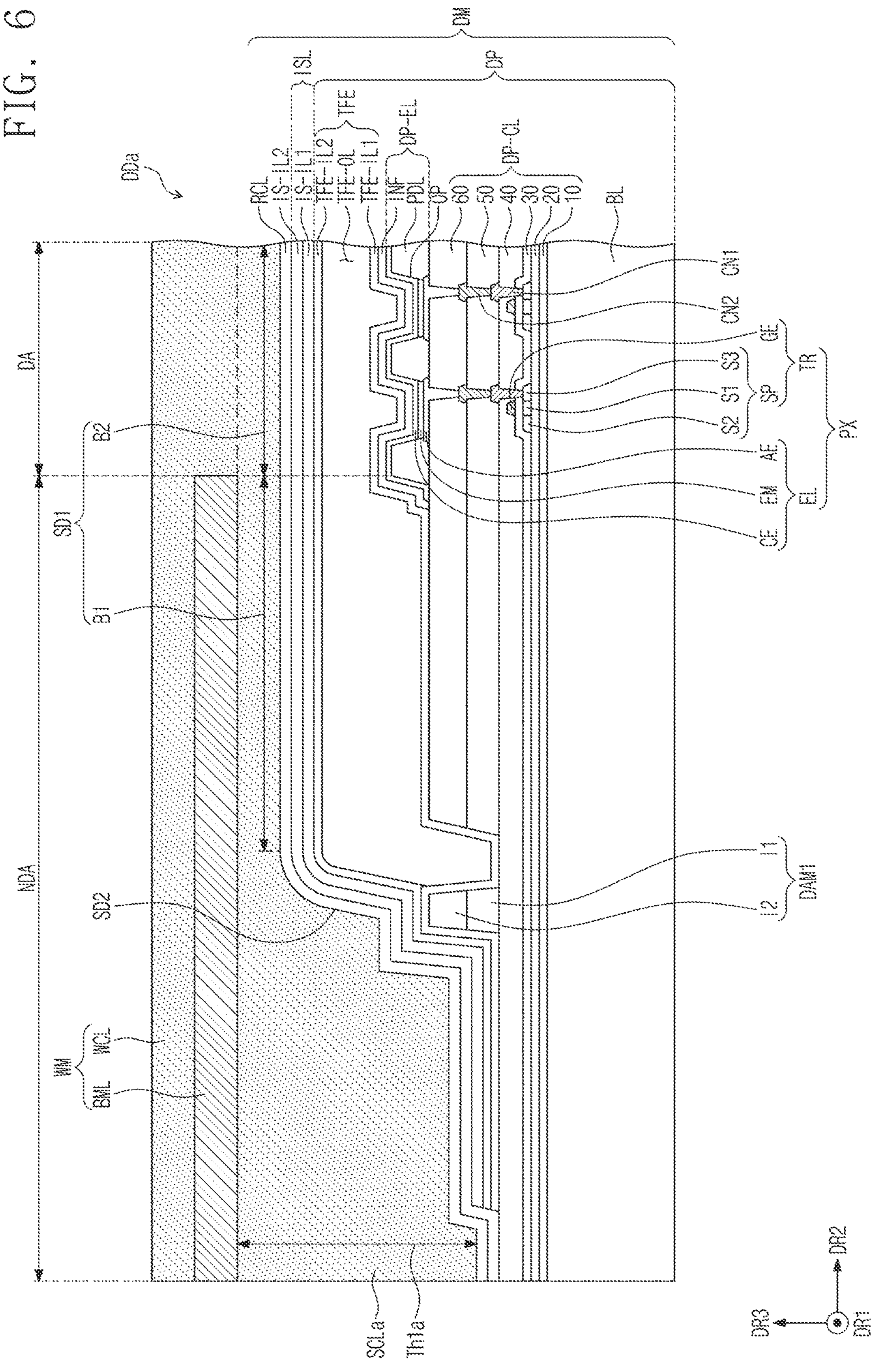
FIG. 6 is a partially enlarged cross-sectional view of an embodiment of the display device according to the disclosure.

FIG. 6 is a partially enlarged cross-sectional view of an embodiment of the display device according to the disclosure.

Referring to FIG. 6, a display device DDa in an embodiment of the disclosure may include a step difference compensation layer SCLa disposed between the display module DM and the window WM. Hereinafter, a description duplicated with FIG. 5 will be omitted.

The step difference compensation layer SCLa may overlap the display area DA and the non-display area NDA. The step difference compensation layer SCLa may be disposed on the first portion B1 of the first surface SD1 and the second surface SD2 of the display module DM in the non-display area NDA. The step difference compensation layer SCLa may be disposed on the second portion B2 of the first surface SD1 in the display area DA. As illustrated, the step difference compensation layer SCLa overlaps a portion of the display area DA, but the disclosure is not limited thereto, and the step difference compensation layer SCLa may overlap the entirety of the display area DA. That is, the step difference compensation layer SCLa may be disposed on the display module DM to cover the entirety of the upper surface of the light control layer RCL.

In an embodiment of the disclosure, a thickness Th1*a* of the step difference compensation layer SCLa overlapping the second surface SD2 may be greater than the step difference between the first surface SD1 and the second surface SD2. In detail, the thickness Th1*a* of the step difference compensation layer SCLa may be greater than the interval between the extension surface of the first surface SD1 and the second surface SD2 in a normal direction of the first surface SD1, that is, in the third direction DR3.

The step difference compensation layer SCLa may be disposed on the display module DM. The step difference compensation layer SCLa may overlap the display area DA and the non-display area NDA. That is, the step difference compensation layer SCLa may be disposed on the display module DM while in contact with the first surface SD1 and the second surface SD2 of the display module DM. The step difference compensation layer SCLa may have a flat surface so that a component disposed on the step difference compensation layer SCLa may be disposed on the flat surface.

The light shielding layer BML may be disposed on the step difference compensation layer SCLa. The light shielding layer BML may overlap the non-display area NDA and may be directly disposed on the step difference compensation layer SCLa. The display device DD in an embodiment of the disclosure includes the step difference compensation layer SCLa for compensating for the step difference of the display module DM in the non-display area NDA so that the light shielding layer BML is disposed on the flat surface. Thus, insufficient coating of the light shielding layer BML disposed on the step difference compensation layer SCLa and the display module DM may be improved, and accordingly, boundary visibility occurring in an area overlapping the second surface SD2 may be prevented, The window coating layer WCL may be disposed on the step difference compensation layer SCLa. The window coating layer WCL may be formed in direct contact with the light shielding layer BML on the light shielding layer BML in the non-display area NDA and in direct contact with the step difference compensation layer SCLa in the display area DA.

In an embodiment of the disclosure, the step difference compensation layer SCLa and the window coating layer WCL may include the same material each other. In detail, the step difference compensation layer SCLa may include a material having a light transmittance of about 90% or more. Like the window coating layer WCL, the step difference compensation layer SCLa may include at least one selected from the groups consisting of polycarbonate, polymethylmethacrylate, polyimide, polyethylene terephthalate, polyacrylate, polyethylenenaphthalate, polyvinylidene chloride, polyvinylidene difluoride, polystyrene, ethylene vinylalcohol copolymer, and triacetyl cellulose. As the step difference compensation layer SCLa includes or consists of the same material as that of the window coating layer WCL, the step difference compensation layer SCLa may be unitary with the window coating layer WCL in the display area DA. The step difference compensation layer SCLa may be a coating layer having hard properties. In an embodiment of the disclosure, the step difference compensation layer SCLa and the window coating layer WCL may have a modulus of about 1 GPa or more. However, the disclosure is not limited thereto, and the step difference compensation layer SCLa may include or consist of a material different from that of the window coating layer WCL. In this case, the window coating layer WCL may have a modulus of about 1 GPa or higher, and the step difference compensation layer SCLa may have a modulus of about 1 GPa or lower.

Figure 7:
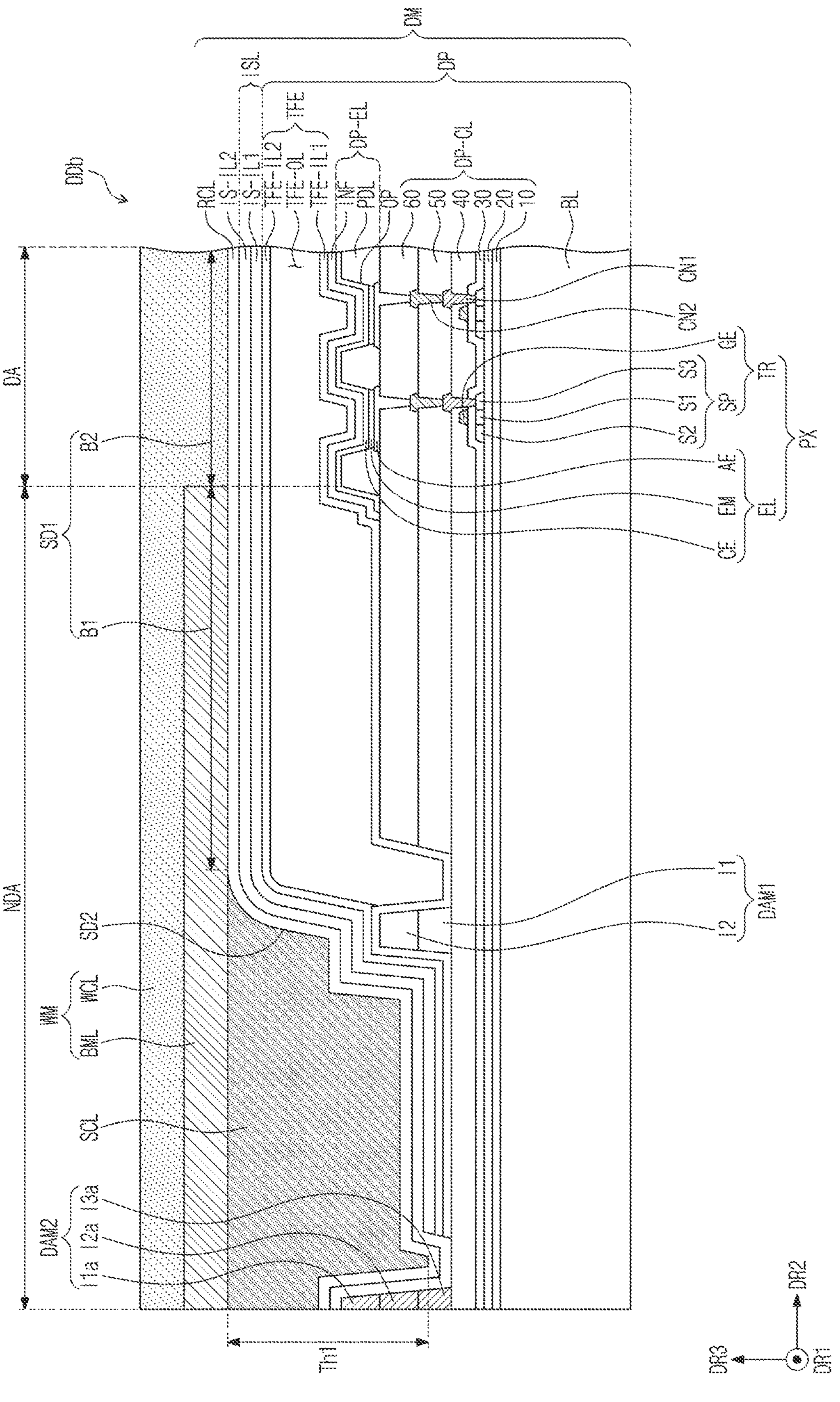
FIG. 7 is a partially enlarged cross-sectional view of an embodiment of the display device according to the disclosure.

FIG. 7 is a cross-sectional view of an embodiment of the display device according to the disclosure.

Referring to FIG. 7, the display device DDb in an embodiment of the disclosure may further include a second dam (or a dam) DAM2 disposed in the non-display area NDA, as compared to the display device DD illustrated in FIG. 5.

The second dam DAM2 may be disposed on the display module DM in the non-display area NDA. In detail, the second dam DAM2 may be disposed outside the step difference compensation layer SCL, that is, in the direction opposite to the second direction DR2, on the second surface SD2. The second dam DAM2 may block the step difference compensation layer SCL from flowing toward a border of the display module DM. Accordingly, the second dam DAM2 may be disposed outside the step difference compensation layer SCL in the non-display area NDA.

The second dam DAM2 may have a multi-layer structure. In an embodiment, the second dam DAM2 may include first to third layers I1*a*, I2*a*, and I3*a*, for example. Some of the layers I1*a*, I2*a*, and I3*a* included in the second dam DAM2 may be simultaneously formed through the same process as that of the layers I1 and I2 of the first dam DAM1. The first dam DAM1 and the second dam DAM2 may have various structures, and the disclosure is not limited to a particular embodiment. At least some of the plurality of layers included in the second dam DAM2 may be simultaneously formed during the process of forming the insulating layers 10 to 60 of the circuit layer DP-CL or the pixel defining film PDL. It is illustrated that a height of the second dam DAM2 is smaller than the thickness Th1 of the step difference compensation layer SCL, but the disclosure is not limited thereto, and the height of the second dam DAM2 may be equal to the thickness Th1 of the step difference compensation layer SCL overlapping the second surface SD2.

FIGS. 8A to 8F are cross-sectional views illustrating an embodiment of some operations of a process of manufacturing the display device according to the disclosure.

Figure 8A:
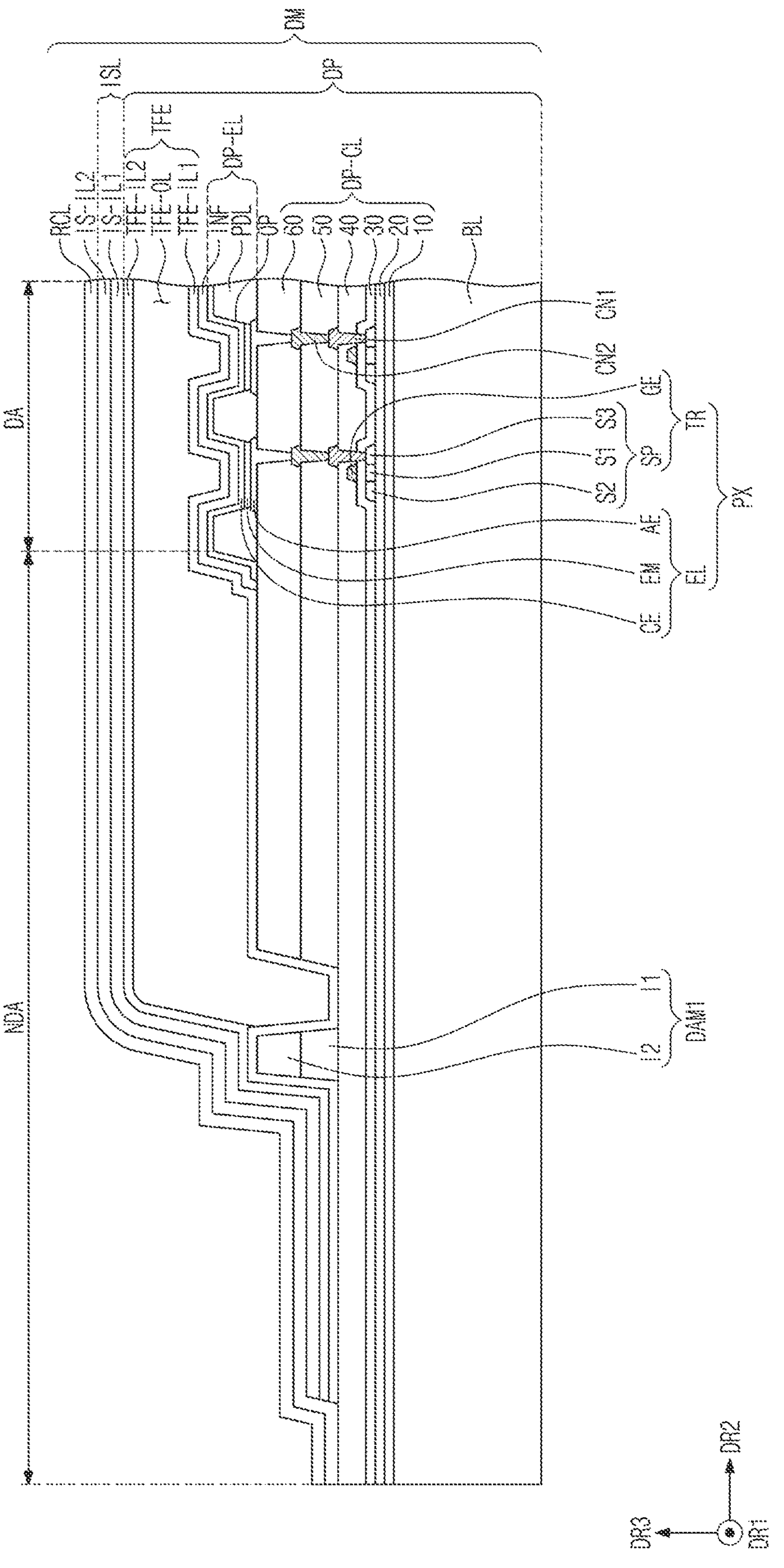
FIGS. 8A to 8F are cross-sectional views illustrating an embodiment of some operations of a process of manufacturing the display device according to the disclosure.

Referring to FIG. 8A, the display module DM may be provided. In detail, the display module DM illustrated in FIG. 8A may be the same as the display module DM illustrated in FIG. 5. The display module DM may include the display panel DP including the display area DA and the non-display area NDA and the light control layer RCL disposed on the display panel DP. The display module DM may further include the input sensing layer ISL disposed between the display panel DP and the light control layer RCL.

Figure 8B:
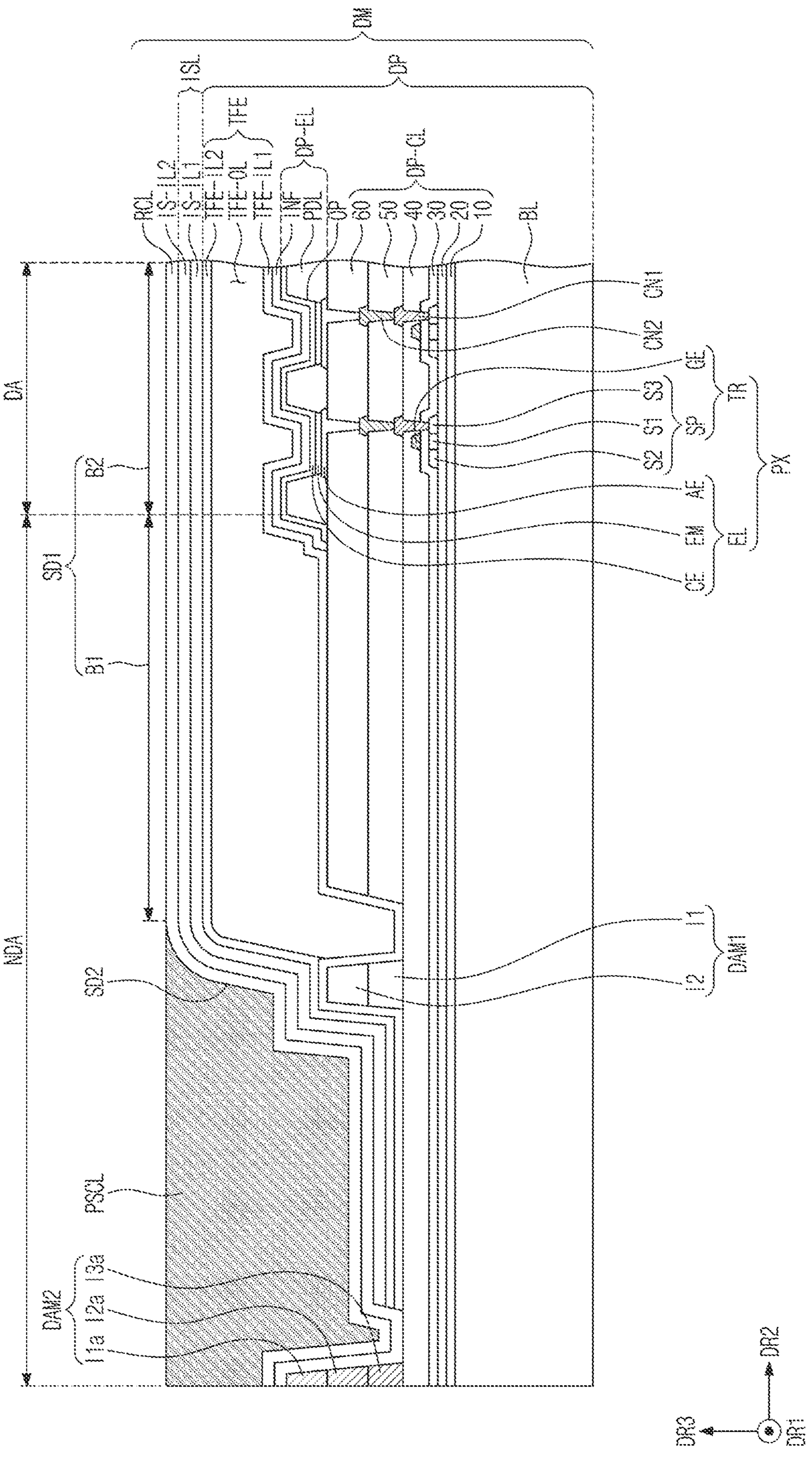

Referring to FIG. 8B, a preliminary step difference compensation layer PSCL may be formed on the display module DM. In detail, the preliminary step difference compensation layer PSCL may overlap the second surface SD2 in a plan view. That is, the preliminary step difference compensation layer PSCL may be formed in direct contact with the second surface SD2. Although not illustrated, the preliminary step difference compensation layer PSCL may overlap a portion of the first surface SD1. In detail, the preliminary step difference compensation layer PSCL may be formed to overlap and contact the first portion B1 of the first surface SD1.

The preliminary step difference compensation layer PSCL may include or consist of a resin. The resin may include at least one of an acryl-based adhesive resin, a silicone-based adhesive resin, and a urethane-based adhesive resin. A resin component may include an uncured oligomer or monomer. The uncured oligomer or monomer may include a cross-linking reactor. Further, the resin may include an initiator and a curing agent. The initiator may be a thermal initiator or a photoinitiator.

An operation of forming the preliminary step difference compensation layer PSCL may further include an operation of applying a resin and an operation of pressing the resin after applying the resin. A manner of applying the resin is not particularly limited, but may be performed by a dispensing printing process, an ink-jet printing process, a screen printing process, or the like. The preliminary step difference compensation layer PSCL may be formed in the non-display area NDA so that the resin is applied to overlap the second surface SD2, the resin is pressed, and thus an upper surface of the resin is parallel to a plane defined by the first surface SD1 of the display module DM.

The operation of forming the preliminary step difference compensation layer PSCL may further include an operation of arranging the dam DAM2 on the non-display area NDA before the operation of applying a resin. The dam DAM2 may correspond to the second dam DAM2 illustrated in FIG. 7. The dam DAM2 may have a multi-layer structure. The dam DAM2 may include first to third layers I1*a*, I2*a*, and I3*a*. Some of the layers I1*a*, I2*a*, and I3*a* included in the dam DAM2 may be simultaneously formed through the same process as that of the layers I1 and I2 of the first dam DAM1. At least some of the plurality of layers included in the second dam DAM2 may be simultaneously formed during the process of forming the insulating layers 10 to 60 of the circuit layer DP-CL or the pixel defining film PDL. The dam DAM2 may be disposed outside the step difference compensation layer SCL, that is, in the direction opposite to the second direction DR2, on the second surface SD2. Accordingly, the dam DAM2 may be disposed on the outermost side of the non-display area NDA. In the operation of pressing the resin, the dam DAM2 may prevent the resin from outflowing to an outside of the dam DAM2, that is, in the direction opposite to the second direction DR2.

Figure 8C:
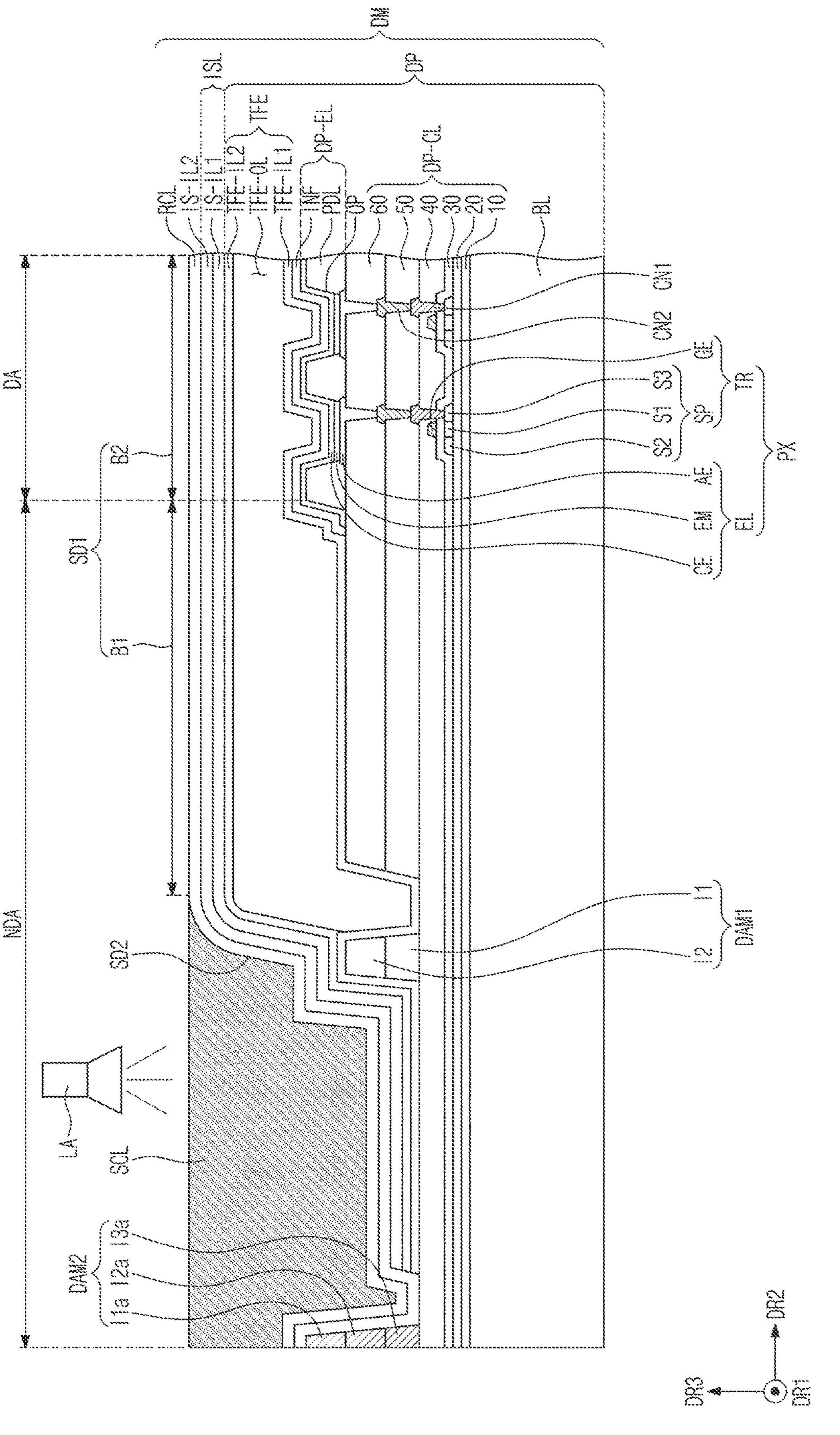
Figure 8D:
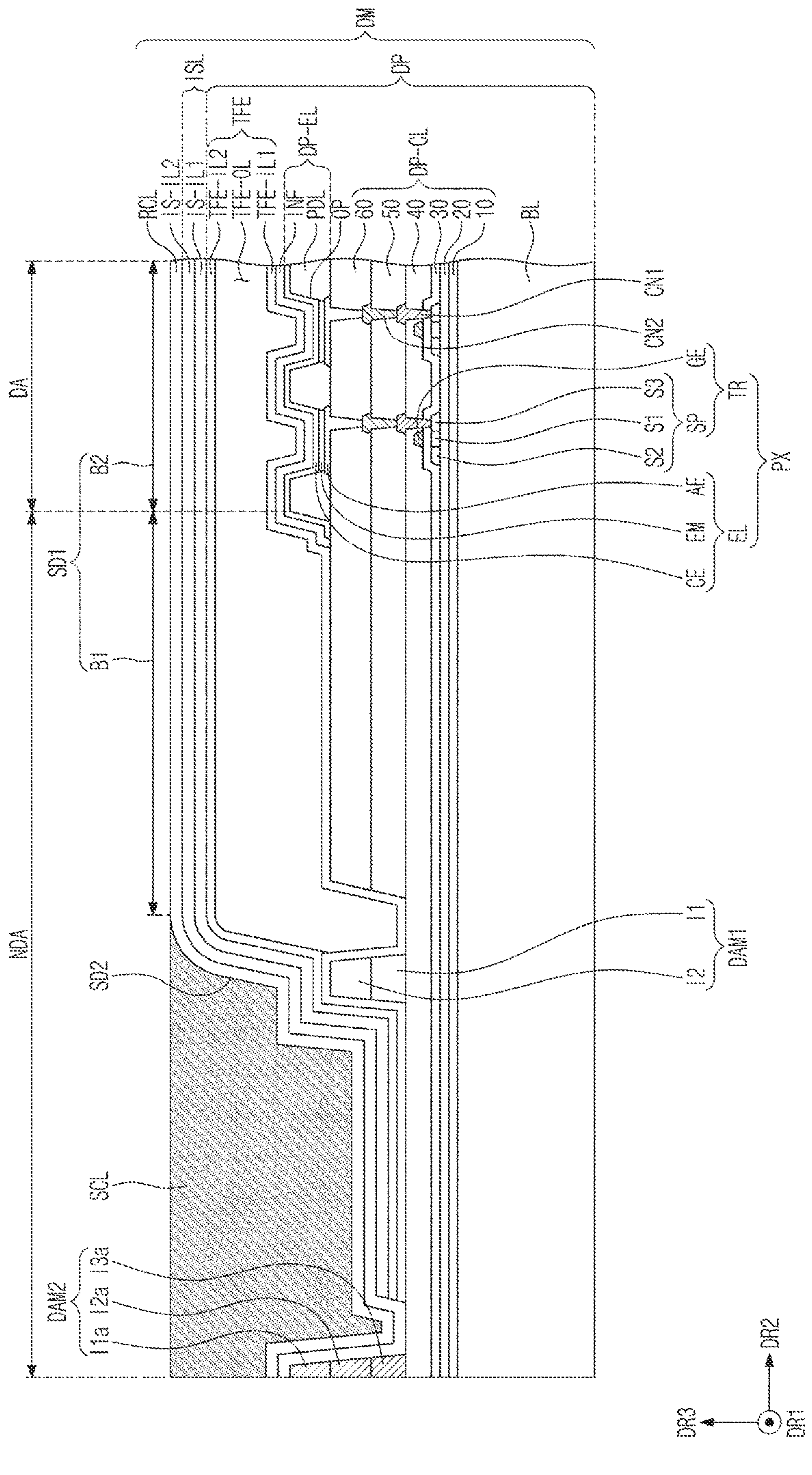

Referring to FIGS. 8C and 8D, the step difference compensation layer SCL may be formed on the display module DM.

A method of manufacturing a display device in an embodiment of the disclosure may include an operation of forming the step difference compensation layer SCL by applying light or heat to the preliminary step difference compensation layer PSCL. Hereinafter, a state in which a light beam is applied to the preliminary step difference compensation layer PSCL will be described as an example. In the operation of curing the preliminary step difference compensation layer PSCL, the light beam may be applied to the entirety of the preliminary step difference compensation layer PSCL.

The preliminary step difference compensation layer PSCL may be irradiated with a light beam, e.g., ultraviolet rays, and thus the pressed preliminary step difference compensation layer PSCL may be cured. The light beam may be applied to the preliminary step difference compensation layer PSCL from a light source LA disposed on the preliminary step difference compensation layer PSCL. The preliminary step difference compensation layer PSCL, which is a liquid coating layer, may be converted into the step difference compensation layer SCL by the light beam provided from the light source LA. In an embodiment, an operation of pressing the preliminary step difference compensation layer PSCL and an operation of curing the preliminary step difference compensation layer PSCL may be simultaneously performed. The step difference compensation layer SCL may be a coating layer having hard properties. In an embodiment of the disclosure, the step difference compensation layer SCL may have a modulus of 1 GPa or more.

Figure 8E:
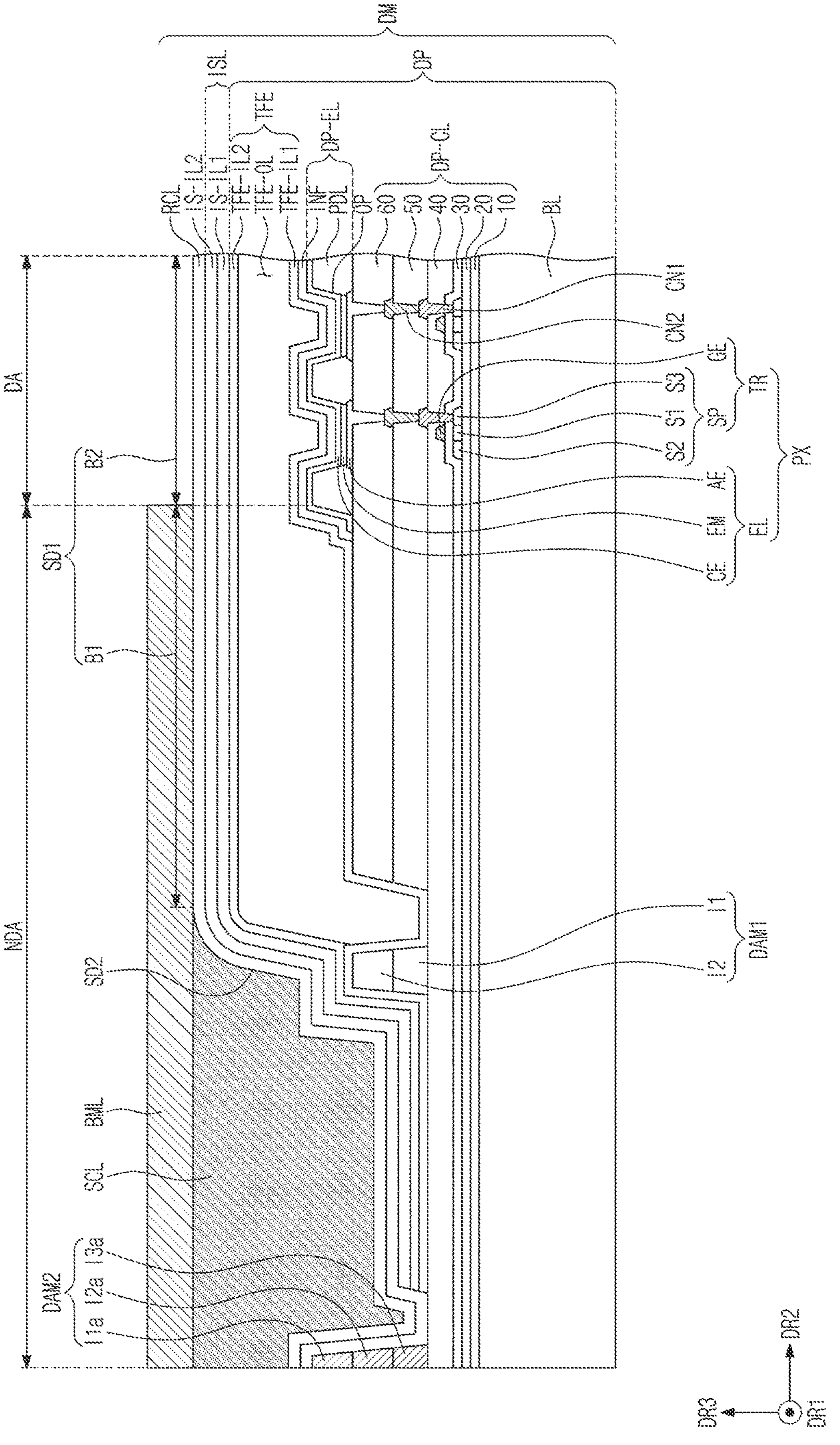

Referring to FIG. 8E, the light shielding layer BML may be formed on the step difference compensation layer SCL and the display module DM. The light shielding layer BML may overlap the non-display area NDA and may be directly disposed on the step difference compensation layer SCL. The light shielding layer BML may include the shielding ink that shields the light beam. In an embodiment, the shielding ink layer may include the base material and the shielding ink. The shielding ink may be the carbon black particle, for example. A manner of forming the light shielding layer BML is not particularly limited, but may be performed by a dispensing printing process, an ink-jet printing process, a screen printing process, or the like.

The light shielding layer BML may be disposed on a flat upper surface of the step difference compensation layer SCL that compensates for a step difference of the display module DM in the non-display area NDA. Thus, in the display device DD according to the disclosure, the light shielding layer BML is disposed on the flat surface. Thus, insufficient coating of the light shielding layer BML disposed on the step difference compensation layer SCL and the display module DM may be improved, and accordingly, boundary visibility occurring in an area overlapping the second surface SD2 may be prevented, Referring to FIG. 8F, after the light shielding layer BML is disposed, the window coating layer WCL may be disposed. The window coating layer WCL may be formed in direct contact with the light shielding layer BML on the light shielding layer BML in the non-display area NDA and in direct contact with the first surface SD1 of the display module DM in the display area DA.

The window coating layer WCL may be formed by pressing and curing a resin. That is, after the resin is applied to the light shielding layer BML and the display module DM, the resin is pressed using a stamp and is cured, and thus the window coating layer WCL may be formed.

The window coating layer WCL may have a light transmittance of about 90% or more. The window coating layer WCL may include a material having a light transmittance of about 90% or more. In an embodiment of the disclosure, the window coating layer WCL may include at least one selected from the groups consisting of polycarbonate, polymethylmethacrylate, polyimide, polyethylene terephthalate, polyacrylate, polyethylenenaphthalate, polyvinylidene chloride, polyvinylidene difluoride, polystyrene, ethylene vinylalcohol copolymer, and triacetyl cellulose. However, the material of the window coating layer WCL is not limited thereto.

Figure 8F:
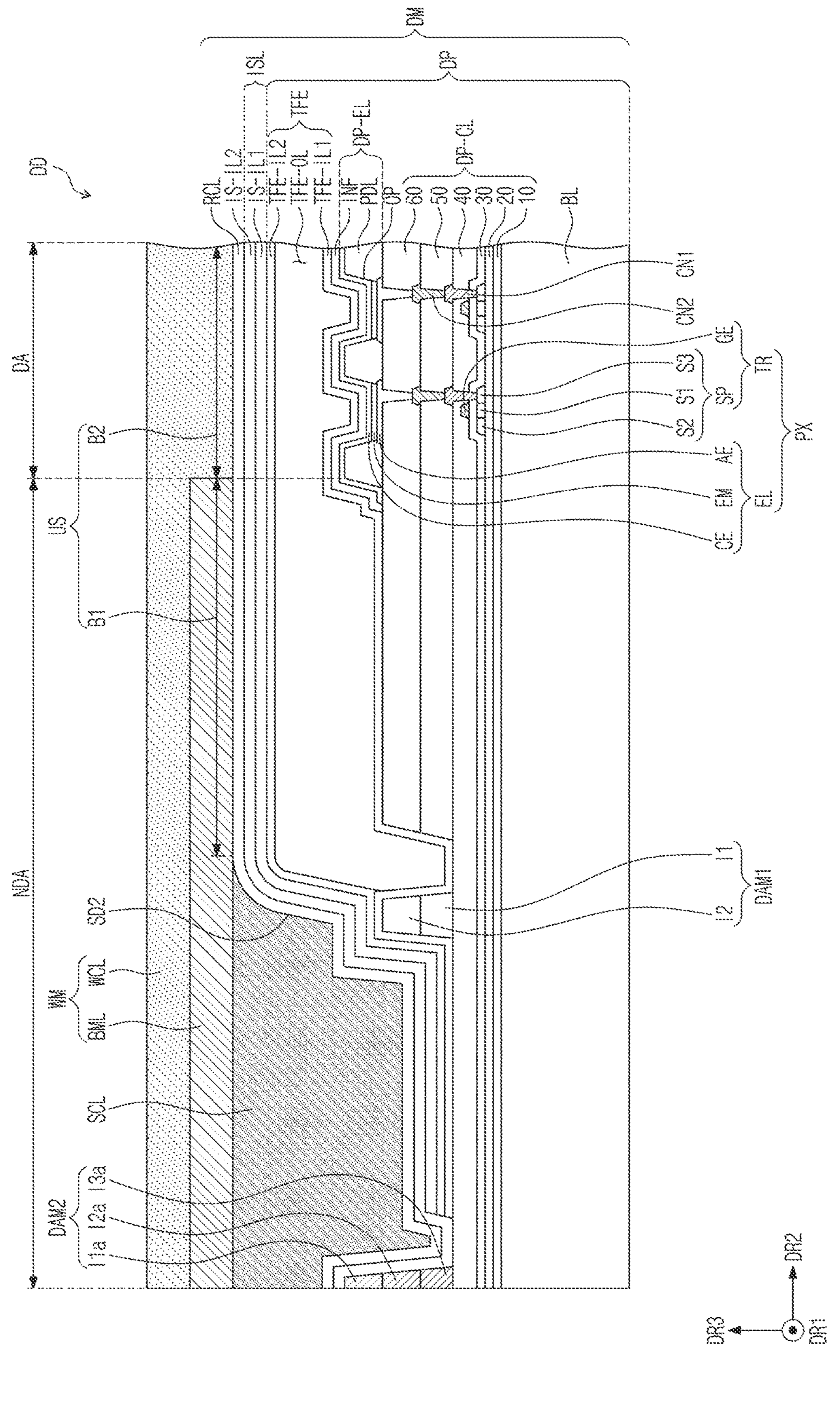

It is illustrated in FIG. 8F that no component is in the window WM, the disclosure is not limited thereto, and a functional coating layer or the like may be disposed on the window WM. The functional coating layer may include at least one of an anti-fingerprint layer, an anti-reflection layer, and a hard coating layer. Although not illustrated, after the window WM is formed, an outer portion of the dam DAM2, that is, a portion of the dam DAM2 in the direction opposite to the second direction DR2, may be cut.

Figure 9A:
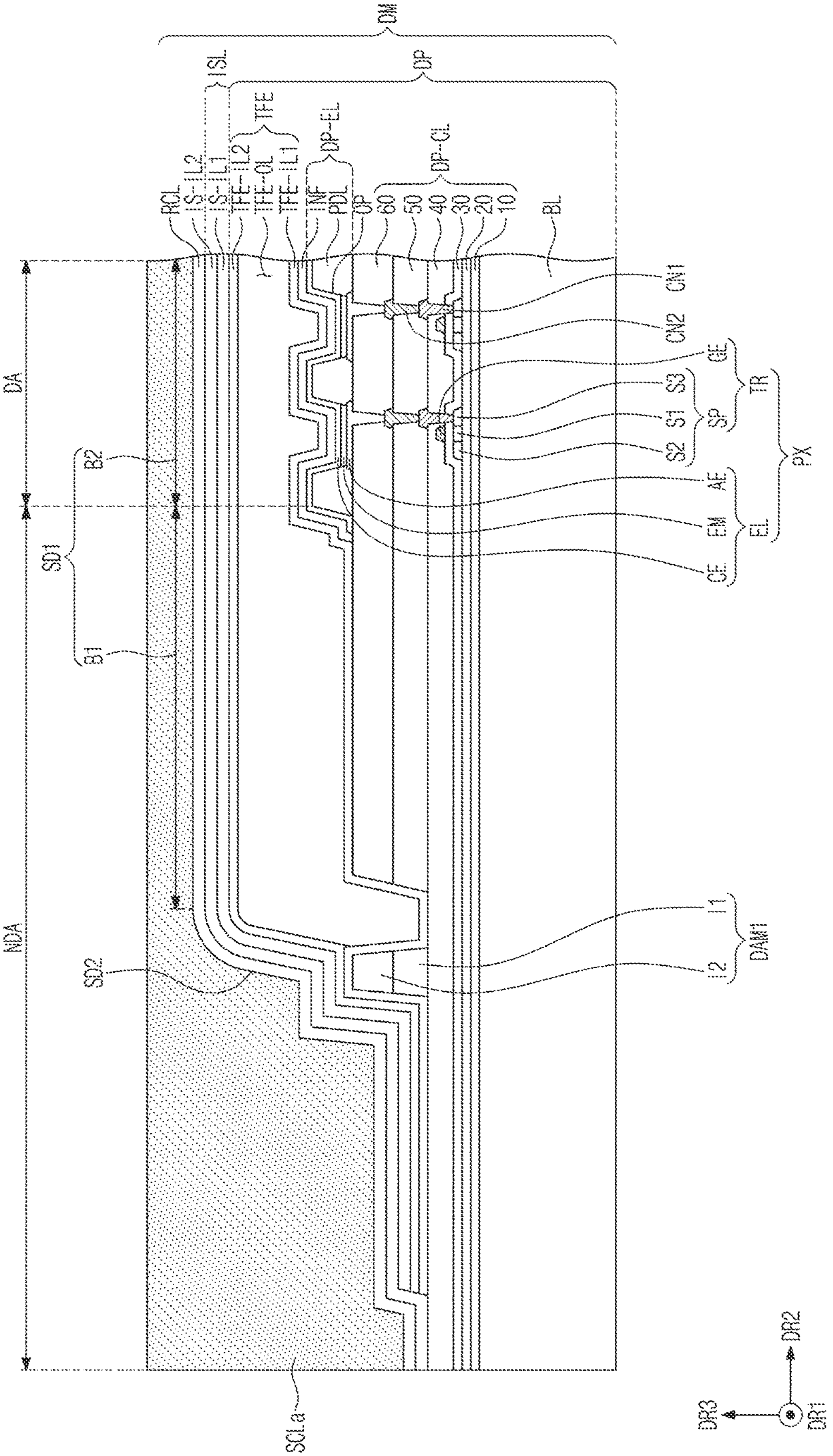
FIGS. 9A to 9C are cross-sectional views illustrating an embodiment of some operations of a process of manufacturing the display device according to the disclosure.
Figure 9B:
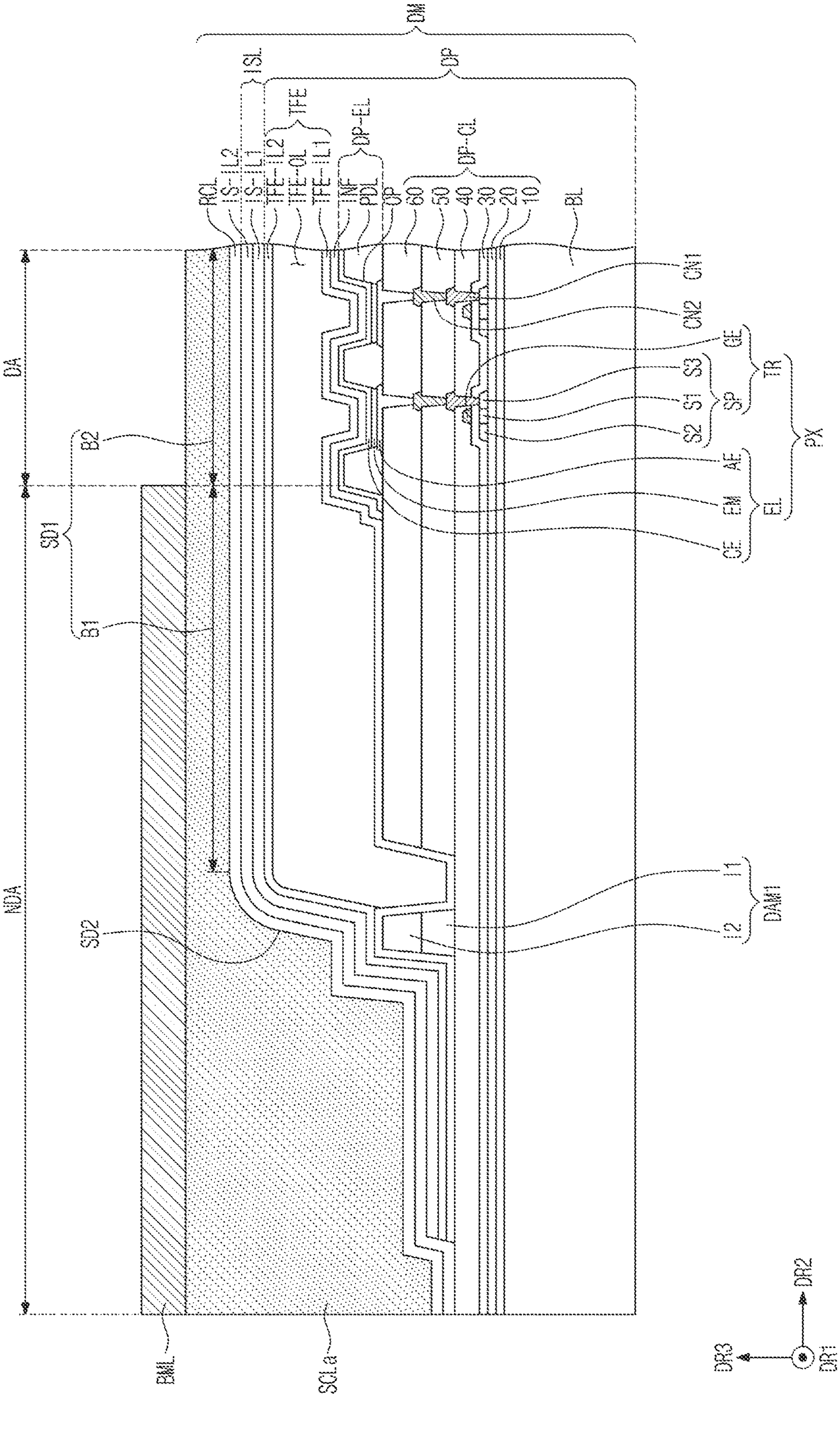
Figure 9C:
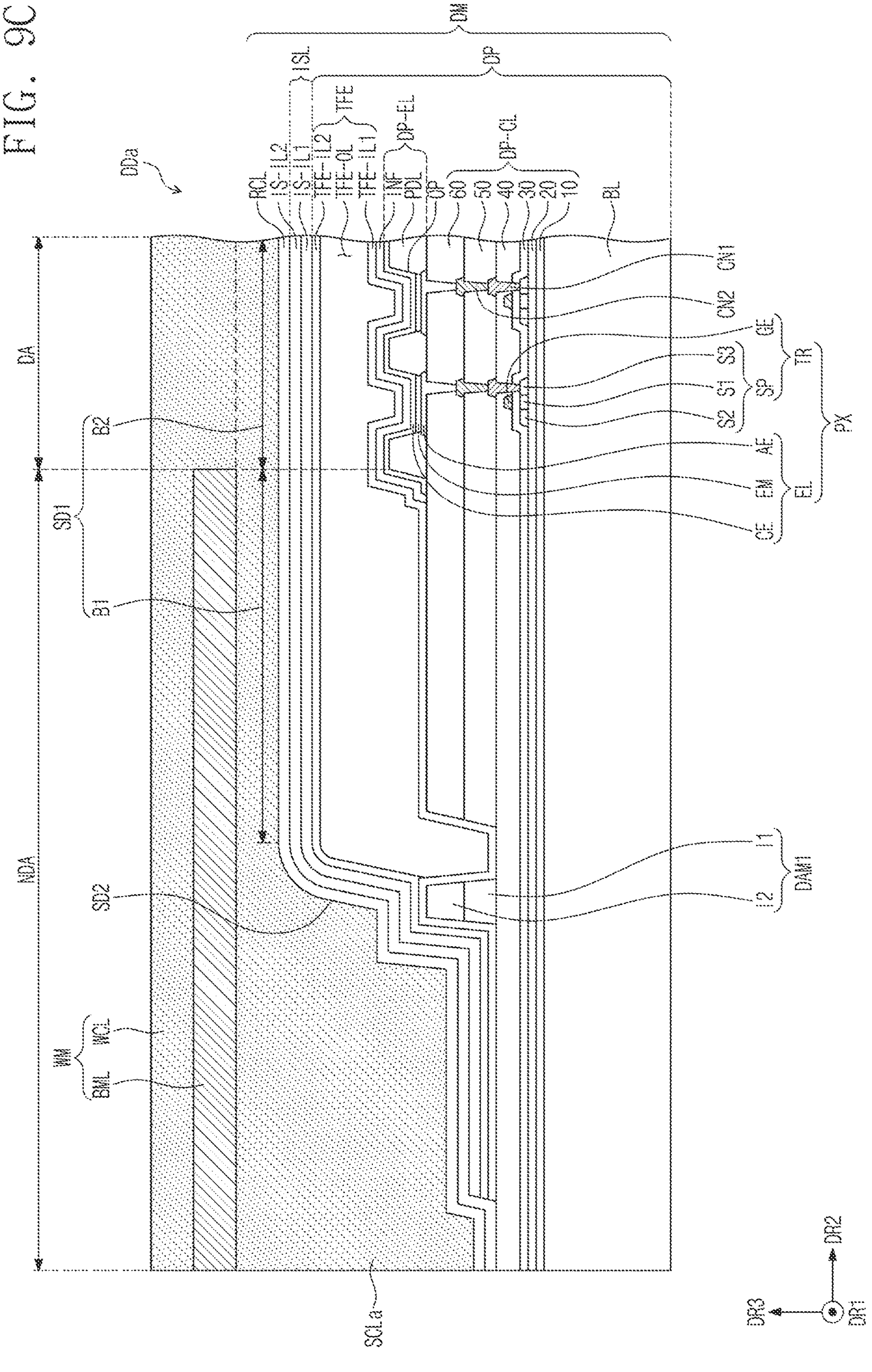

FIGS. 9A to 9C are cross-sectional views illustrating an embodiment of some operations of a process of manufacturing the display device according to the disclosure.

Referring to FIG. 9A, the step difference compensation layer SCLa may be formed on the display module DM. In an embodiment of the disclosure, the step difference compensation layer SCLa may overlap a portion of the display area DA. However, the disclosure is not limited thereto, and the step difference compensation layer SCLa may overlap the entirety of the display area DA. That is, the step difference compensation layer SCLa may be directly disposed on the display module DM to cover the display module DM.

The step difference compensation layer SCLa may be formed by pressing and curing a resin. That is, after the resin is applied onto the display module DM, the resin is pressed using a stamp and is cured, and thus the step difference compensation layer SCLa may be formed. The step difference compensation layer SCLa may include at least one selected from the groups consisting of polycarbonate, polymethylmethacrylate, polyimide, polyethylene terephthalate, polyacrylate, polyethylenenaphthalate, polyvinylidene chloride, polyvinylidene difluoride, polystyrene, ethylene vinylalcohol copolymer, and triacetyl cellulose.

Referring to FIG. 9B, the light shielding layer BML may be formed on the step difference compensation layer SCLa.

The light shielding layer BML may overlap the non-display area NDA and may be directly disposed on the step difference compensation layer SCLa. The light shielding layer BML may include the shielding ink that shields the light beam. In an embodiment, the shielding ink layer may include the base material and the shielding ink, for example. The shielding ink may be a carbon black particle. A manner of forming the light shielding layer BML is not particularly limited, but may be performed by a dispensing printing process, an ink-jet printing process, a screen printing process, or the like.

The light shielding layer BML may be disposed on a flat upper surface of the step difference compensation layer SCLa that compensates for a step difference of the display module DM in the non-display area NDA. Thus, in the display device DD according to the disclosure, the light shielding layer BML is disposed on the flat surface. Thus, insufficient coating of the light shielding layer BML disposed on the step difference compensation layer SCLa and the display module DM may be improved, and accordingly, boundary visibility occurring in an area overlapping the second surface SD2 may be prevented, Referring to FIG. 9C, after the light shielding layer BML is disposed, the window coating layer WCL may be disposed. The window coating layer WCL may be formed in direct contact with the light shielding layer BML on the light shielding layer BML in the non-display area NDA and in direct contact with the upper surface of the step difference compensation layer SCLa in the display area DA. The window coating layer WCL and the step difference compensation layer SCLa may include the same material each other. Accordingly, the window coating layer WCL may be unitary with the step difference compensation layer SCLa.

The display device in an embodiment of the disclosure includes a step difference compensation layer that compensates for a step difference of a display module in a non-display area, and thus application defects of a light shielding layer caused by the step difference and boundary visibility caused by the application defects may be improved.

Although the description has been made above with reference to an embodiment of the disclosure, it may be understood that those skilled in the art or those having ordinary knowledge in the art may variously modify and changes the disclosure without departing from the spirit and technical scope of the disclosure described in the appended claims.

Accordingly, the technical scope of the disclosure is not limited to the detailed description of the specification, but should be defined by the appended claims.

What is claimed is:

1. A display device comprising:

a display module which includes a display panel including a display area and a non-display area adjacent to the display area and a light control layer disposed on the display panel;

a step difference compensation layer which overlaps the non-display area, is disposed on and overlaps a step difference of the display module in the non-display area and compensates for the step difference; and a window disposed on the display module, the window including:

a light shielding layer overlapping the non-display area and being disposed on the step difference compensation layer; and a window coating layer disposed on the light shielding layer and the display module.

2. The display device of claim 1, wherein the display module includes a first surface corresponding to an upper surface of the display module and a second surface extending outward from the first surface, and the step difference is defined between the first surface and the second surface.

3. The display device of claim 2, wherein the step difference compensation layer overlaps the second surface in a plan view.

4. The display device of claim 3, wherein the first surface includes a first portion overlapping the non-display area and a second portion overlapping the display area, and the step difference compensation layer overlaps the first portion.

5. The display device of claim 4, further comprising:

a dam disposed outside the step difference compensation layer in the non-display area.

6. The display device of claim 2, wherein the step difference compensation layer is disposed between the light shielding layer and the display module and includes a resin.

7. The display device of claim 6, wherein a thickness of the step difference compensation layer is equal to an interval between the first surface and the second surface in a normal direction of the first surface.

8. The display device of claim 2, wherein the step difference compensation layer partially overlaps the display area.

9. The display device of claim 8, wherein the step difference compensation layer and the window coating layer include a same material each other.

10. The display device of claim 9, wherein the step difference compensation layer is extended from the window coating layer in the display area to be unitary with the window coating layer.

11. The display device of claim 9, wherein a thickness of the step difference compensation layer is greater than an interval between the first surface and the second surface in a normal direction of the first surface.

12. The display device of claim 1, wherein the window coating layer overlaps the display area and the non-display area and contacts an upper surface of the light control layer in the display area.

13. The display device of claim 1, wherein the display panel includes:

a base layer;

a pixel defining film which is disposed on the base layer and in which an opening is defined;

a light emission element including a light emission layer disposed inside the opening;

an inorganic deposition layer disposed on the light emission element; and an encapsulation layer disposed on the inorganic deposition layer.

14. The display device of claim 1, wherein the light control layer includes at least one of a dye and a pigment, and the dye and the pigment included in the light control layer have a maximum absorption wavelength in a wavelength range of about 490 nanometers to about 505 nanometers and about 585 nanometers to about 600 nanometers.

15. A method of manufacturing a display device, the method comprising:

forming a display module including a display panel including a display area and a non-display area and a light control layer disposed on the display panel;

forming a step difference compensation layer on the display module so that the step difference compensation layer is disposed on and overlaps a step difference of the display module in the non-display area and compensates for the step difference;

forming a light shielding layer overlapping the non-display area on the step difference compensation layer; and forming a window coating layer on the light shielding layer and the display module.

16. The method of claim 15, wherein the forming the step difference compensation layer includes:

applying a resin and forming a preliminary step difference compensation layer on the display module; and curing the preliminary step difference compensation layer and forming the step difference compensation layer.

17. The method of claim 16, further comprising:

arranging a dam in the non-display area before the applying the resin, wherein the dam is disposed outside the preliminary step difference compensation layer in the non-display area.

18. The method of claim 15, wherein the step difference compensation layer partially overlaps the display area.

19. The method of claim 18, wherein the forming the window coating layer includes:

arranging the window coating layer on the light shielding layer and the step difference compensation layer.

20. An electronic device comprising:

a display module which includes a display panel including a display area and a non-display area adjacent to the display area and a light control layer disposed on the display panel;

a step difference compensation layer which overlaps the non-display area, is disposed on and overlaps a step difference of the display module in the non-display area and compensates for the step difference; and a window disposed on the display module, the window including:

a light shielding layer overlapping the non-display area and being disposed on the step difference compensation layer; and a window coating layer disposed on the light shielding layer and the display module.

* * * * *